United States Patent [19]
Holland et al.

[11] Patent Number: 6,028,395
[45] Date of Patent: Feb. 22, 2000

[54] VACUUM PLASMA PROCESSOR HAVING COIL WITH ADDED CONDUCTING SEGMENTS TO ITS PERIPHERAL PART

[75] Inventors: John Patrick Holland, Santa Clara; Alex Demos, San Francisco, both of Calif.

[73] Assignee: Lam Research Corporation, Fremont, Calif.

[21] Appl. No.: 08/931,504

[22] Filed: Sep. 16, 1997

[51] Int. Cl.[7] .................................................. H01J 7/24
[52] U.S. Cl. .............................. 315/111.51; 315/111.21; 156/345; 118/723 I
[58] Field of Search .................... 315/111.21, 111.51, 315/111.71; 118/723 I, 723 IR; 156/345, 643.1; 219/121.36, 121.41, 121.43

[56] References Cited

U.S. PATENT DOCUMENTS

| | | | |
|---|---|---|---|
| 4,948,458 | 8/1990 | Ogle | 156/643 |
| 5,309,063 | 5/1994 | Singh | 315/111.51 |
| 5,401,350 | 3/1995 | Patrick et al. | 156/345 |
| 5,589,737 | 12/1996 | Barnes et al. | 315/111.21 |
| 5,800,619 | 9/1998 | Holland et al. | 118/723 I |
| 5,847,918 | 12/1998 | Shufflebotham et al. | 361/234 |

FOREIGN PATENT DOCUMENTS

| | | |
|---|---|---|
| 0 553 704 A1 | 8/1993 | European Pat. Off. . |
| 0 607 797 A1 | 7/1994 | European Pat. Off. . |
| 694 949 | 1/1996 | European Pat. Off. . |
| 710 055 A1 | 5/1996 | European Pat. Off. . |
| 0 759 632 A1 | 8/1996 | European Pat. Off. . |
| 727 807 A1 | 8/1996 | European Pat. Off. . |
| 756 309 A1 | 1/1997 | European Pat. Off. . |
| 788 138 A2 | 8/1997 | European Pat. Off. . |
| 807 953 A1 | 11/1997 | European Pat. Off. . |
| 813 227 A2 | 12/1997 | European Pat. Off. . |
| WO 95/15672 | 6/1995 | WIPO . |
| WO 96/18208 | 6/1996 | WIPO . |
| WO 97/08734 | 3/1997 | WIPO . |

*Primary Examiner*—Don Wong
*Assistant Examiner*—Haissa Philogene
*Attorney, Agent, or Firm*—Lowe Hauptman Gopstein Gilman & Berner

[57] ABSTRACT

A vacuum plasma processor for treating a workpiece with an RF plasma has a plasma excitation coil including a peripheral portion supplying a substantial magnetic flux density to peripheral portions of the plasma. Additional conducting segments spatially adjacent to and electrically connected to a segment of the peripheral portion supply additional magnetic flux having a substantial magnetic flux density to the plasma peripheral portions. The additional conductor segments are in each of four corners of the coil, being connected electrically in parallel or series to coil conductor segments forming the corners. In another embodiment, the coil includes several nested conducting corner segments. In different embodiments, the corner segments are (1) coplanar with the remainder of the coil and (2) closer to the plasma than the remainder of the coil. The coil includes two electrically parallel, spiral like windings, each with an interior terminal connected to one output terminal of a matching network and an output terminal connected via a capacitor to another output terminal of the matching network. The capacitor values and the lengths of the windings relative to the plasma RF excitation wavelength are such that current flowing in the coil has maximum and minimum standing wave values in the peripheral and interior coil portions, respectively. The coil and workpiece peripheries have similar rectangular dimensions and geometries.

76 Claims, 13 Drawing Sheets

Silicon Etch Rate measurements on 600x720 mm substrate
(Measurements equal spaced within panel and edge measurements made within 15 mm of edge of panel)

Figure 5A

| 1313 | 1563 | 1800 | 1950 | 1930 | 1650 | 1400 |
|------|------|------|------|------|------|------|
| 1695 | 1989 | 2000 | 2065 | 1919 | 1831 | 1700 |
| 1923 | 1904 | 1621 | 1522 | 1600 | 1849 | 1802 |
| 1789 | 2071 | 2023 | 2033 | 2028 | 2031 | 1432 |
| 1360 | 1860 | 2042 | 2027 | 1911 | 1688 | 1365 |

← 600 mm →  ↕ 720 mm

Fig 1 Coil
ETCH RATES, Å/min avg 1791
max 2071
min 1313
range 758
deviation from uniformity 21%

Figure 5B

| 1450 | 1663 | 1696 | 1752 | 1762 | 1678 | 1406 |
|------|------|------|------|------|------|------|
| 1686 | 1700 | 1611 | 1724 | 1645 | 1712 | 1689 |
| 1695 | 1629 | 1560 | 1649 | 1591 | 1710 | 1751 |
| 1517 | 1595 | 1578 | 1755 | 1668 | 1765 | 1693 |
| 1400 | 1513 | 1570 | 1658 | 1673 | 1646 | 1396 |

← 600 mm →  ↕ 720 mm

Fig 4 Coil
ETCH RATES, Å/min avg 1634
max 1765
min 1396
range 369
deviation from uniformity 11%

VACUUM PLASMA PROCESSOR HAVING COIL WITH ADDED CONDUCTING SEGMENTS TO ITS PERIPHERAL PART

FIELD OF INVENTION

The present invention relates generally to vacuum plasma processors and more particularly to such a processor having a coil with a peripheral portion having conducting segments for coupling increased RF excitation fields to the processor plasma.

BACKGROUND ART

Various structures have been developed to supply RF fields to an ionizable gas in a vacuum plasma processing chamber, to excite the gas to a plasma state. The excited plasma interacts with a workpiece in the vacuum plasma processing chamber to etch materials from an exposed workpiece surface or deposit materials on the surface. The workpiece is typically a semiconductor wafer having a planar circular surface, a metal planar surface or a dielectric workpiece, which can have a rectangular periphery, as in a flat panel display.

A processor for treating workpieces with an inductively coupled planar plasma (ICP) is disclosed, inter alia, by Ogle, U.S. Pat. No. 4,948,458, commonly assigned with the present invention. A magnetic field is derived from a coil positioned on or adjacent a single planar dielectric window extending in a direction generally parallel to the workpiece planar surface. In commercial devices, the window is usually quartz because quartz has low material impurity and provides optimum results for RF coupling. The coil is connected to be responsive to an RF source having a frequency in the range of 1 to 100 MHz, but which is typically 13.56 MHz. An impedance matching network is connected between the coil and source, to minimize RF reflections coupled back to the source from a load, including the coil and the plasma.

Barnes et al., U.S. Pat. No. 5,589,737 discloses a plasma processor including a coil for inductively deriving an RF plasma excitation field for processing relatively large substrates, for example, dielectric substrates forming rectangular flat panel displays. In the Barnes et al. patent, the RF field derived by the coil is coupled to the plasma via plural individually supported dielectric windows. In the preferred embodiment of the '737 patent, four such windows are positioned in four different quadrants. To maximize RF coupling from the coil through the windows to the plasma, the windows have a thickness substantially less than the thickness of a single window having the same combined area as the plural windows to withstand the differential pressure between the vacuum inside the chamber and atmospheric pressure on the chamber exterior.

Several different coil configurations are disclosed in the '737 patent. Some of these coils have plural winding segments connected electrically in parallel between first and second terminals coupled to an RF excitation source via a matching network. Some of the coil configurations of the '737 patent have parallel coil segments of the same electrical length between the first and second terminals.

To provide more uniform plasma flux density on the relatively large planar flat panel display surfaces having a rectangular periphery, the various coil configurations disclosed in the '737 patent were redesigned as illustrated in FIG. 1, a bottom view of the redesigned coil. The prior art coil 10 of FIG. 1 includes two spiral-like, electrically parallel copper windings 12 and 14, each having plural spiral-like turns substantially symmetrically arranged with respect to coil center point 16.

Windings 12 and 14 are coplanar and have copper conductors with square cross-sections (with each side having a length of about 1.25 cm), including bottom edges spaced approximately 3 cms above the upper faces of the four rectangular quartz windows 21, 22, 23 and 24, individually supported by one-piece, rigid frame 26, made of a non-magnetic metal, preferably anodized aluminum. Frame 26 is preferably constructed in a manner similar to that illustrated and described in the '737 patent, except that interior mutually perpendicular rails 28 and 30 are substantially coplanar with the top coplanar faces of windows 21–24. Coil 10 is suspended by dielectric hangers from the ceiling of a non-ferrous metal (preferably anodized aluminum) electromagnetic shield cover of the type disclosed in Barnes et al. '737.

Windings 12 and 14 respectively include interior terminals 32 and 34, equispaced from coil center point 16 along rail 28. Terminals 32 and 34 are electrically driven in parallel and connected by metal strap 35 and cable 36 to output terminal 38 of matching network 40, having an input terminal connected to be responsive to RF source 42. Typically, strap 35 has an inverted U shape with a first leg of the U being spaced substantially farther from windows 21 and 24 than windings 12 and 14, and the other legs running between the first leg and terminals 32 and 34; strap 35 is shown offset to simplify the drawing.

Windings 12 and 14 also respectively include, at diametrically opposed corners thereof, terminals 44 and 46, respectively connected to ground through capacitors 48 and 50. Output terminal 52 of matching network 40 is also grounded to provide a return current path through capacitors 48 and 50 to the matching network grounded terminal for the parallel currents flowing through windings 12 and 14. Windings 12 and 14 have a geometry and the values of capacitors 48 and 50 are selected so maximum standing wave currents occur along the lengths of windings 12 and 14 at positions that are somewhat electrically close to terminals 44 and 46. Typically, the maximum standing wave currents occur in the outermost turn of each of windings 12 and 14 in proximity to rail 26. The standing wave current is maximized close to the periphery of coil 10 to increase the magnetic flux density at the periphery of the coil and thereby increase the plasma flux density adjacent the workpiece periphery.

Each of windings 12 and 14 has a spiral-like configuration and is long enough that transmission line effects occur therein at the frequency of source 42, as described in the previously mentioned co-pending applications. The configuration of each of the windings 12 and 14 is frequently referred to as a "square or rectangular" spiral. Each of windings 12 and 14 includes 2.125 turns, formed by nine straight segments. Each winding includes four straight metal conducting segments extending parallel to rail 28 and five straight metal conducting segments extending parallel to rail 30, whereby each straight line segment intersects its abutting segment approximately at a right angle. Terminals 32 and 44 of coil 12 are on one side of rail 30 while terminals 34 and 46 of coil 14 are on the opposite side of rail 30. The pitches of the turns of windings 12 and 14 are substantially the same throughout the lengths of the coils between terminals 32, 34 and 44, 46.

The coil of FIG. 1 can be thought of as having center, intermediate and peripheral portions respectively including approximately two, one and two turns. The turns of the center portion include straight metal conducting segments 61–64 of winding 12, as well as straight metal conducting segments 71–74 of winding 14. The one turn of the intermediate portion includes straight segments 75 and 76 of winding 12 as well as straight segments 77 and 78 of winding 14. The turns of the peripheral portion include straight segments 81–83 of winding 12 as well as straight segments 84–86 of winding 14.

The coil illustrated in FIG. 1 has previously been used to excite a plasma for etching rectangular, dielectric flat panel display workpieces having straight, rectangular peripheral sides of 550×650 mm and 600×720 mm. Such workpieces were fixedly located on an electrostatic chuck so the top face of the substrate was approximately 10 cms from the bottom, interior face of windows 21–24. The rectangular periphery of coil 10 in this prior art arrangement was somewhat greater than the periphery of the rectangular workpiece; in one prior art configuration, coil 10 was dimensioned so the peripheral, straight mutually perpendicular edges thereof were approximately 650×750 mm in dimension so the coil extended to the periphery of the rectangular area defined by windows 21–24 and beyond the rectangular periphery of the workpiece.

While the structure illustrated in FIG. 1 functions satisfactorily for certain circumstances, for other circumstances, the uniformity of the plasma flux density across the large area workpieces is not as great as desired. The plasma flux density on the flat panel display workpieces resulting from the coil illustrated in FIG. 1 has a tendency to be relatively low in center and peripheral portions of the workpiece exposed planar rectangular face and to be relatively large in intermediate portions of the workpiece, between the center and peripheral portions thereof. Hence, the plasma flux density on the workpiece has a tendency to be greatest below the coil intermediate portion, i.e., below the second half of the first turn and the first half of the second turn of each of windings 12 and 14 and to be lowest below the center and peripheral portions of coil 10. The decrease in the plasma flux density at the corners of the peripheral regions of the rectangular workpiece is due to a large extent to the tendency of the plasma resulting from the excitation by coil 10 to have a circular periphery. The tendency of the plasma generation region to have a circular periphery results in the plasma flux density in the peripheral regions of the workpiece directly below the peripheral coil portions removed from the coil corners to be substantially greater than the plasma flux density in the peripheral corner regions of the workpiece. The plasma flux density profile along a diagonal of the treated workpiece face deviates approximately 21% from complete uniformity. The relatively low plasma flux density on the substrate surface portions beneath the center and peripheral portions of coil 10 occurs because the plasma flux has a tendency to diffuse from the center of the plasma toward the intermediate portion of the plasma. The coil metal shield structure associated with the vacuum plasma processing chamber has a tendency to cause the magnetic flux derived from coil 10, FIG. 1, to move away from the chamber periphery toward the center of the chamber, as disclosed in the co-pending, commonly assigned Holland et al. application Ser. No. 08/661,203, filed Jun. 10, 1996 now U.S. Pat. No. 5,800,619.

It is, accordingly, an object of the present invention to provide a new and improved vacuum plasma processor for providing a relatively uniform plasma flux density on the surface of a relatively large workpiece.

Another object of the invention is to provide a new and improved vacuum plasma processor having a coil particularly designed so the magnetic flux density derived from it is such that the plasma flux density on a relatively large rectangular workpiece, such as a flat panel display, is relatively uniform, to obviate the tendency for the plasma flux density to be relatively low over center and peripheral regions of the workpiece.

A further object of the invention is to provide a new and improved coil for a vacuum plasma processor, wherein the coil is particularly designed for providing a relatively uniform plasma flux density on the surface of a relatively large workpiece, particularly workpieces having a rectangular periphery.

THE INVENTION

In accordance with one aspect of the invention, a vacuum plasma processor for treating a workpiece with a plasma comprises the usual vacuum chamber where the workpiece is adapted to be located, wherein the chamber has an inlet for introducing into the chamber a gas which can be converted into the plasma for treating the workpiece. An improved coil is positioned to couple an RF field to the gas for exciting the gas to the plasma state. The RF field derived from a main part of the coil interacts with an electromagnetic shield that substantially confines the coil RF field to structure associated with the processor and interacts with the RF field derived from the main coil part in such a manner as to reduce (a) the RF field derived from the main coil part in a part of the plasma generally aligned with a peripheral portion of the main coil part and (b) plasma flux density in the part of the plasma generally aligned with the main coil part peripheral portion relative to flux density of a portion of the plasma generally inside the part of the plasma generally aligned with the main coil part peripheral portion. To increase the RF field and plasma flux density in the part of the plasma generally aligned with the main coil part peripheral portion, the main coil part peripheral portion includes an additional coil structure for supplying an additional amount of RF field to the portion of the plasma generally aligned with the main coil part peripheral portion.

According to a further aspect of the invention, the coil has a peripheral portion including a pair of adjacent conductor segments having adjacent ends. The adjacent conductor segments form corners and couple to the plasma magnetic fields having longitudinal axes forming corners so the magnetic flux density in the corners formed by the adjacent conductors is substantially higher than the magnetic flux density derived from other peripheral parts of the coil.

Preferably the greater magnetic flux density is achieved by adding additional structure to peripheral parts of the coil. The additional structure is spatially adjacent the adjacent ends and electrically connected to the adjacent conductor segments to establish in the plasma magnetic fields that aid the magnetic fields coupled to the plasma by the adjacent conductor segments.

In some embodiments, the coil includes a segment spatially close to the corner and connected electrically in parallel with the conductor segments forming the corner. In other embodiments the segment spatially close to the corner is connected electrically in series with the conductor segments forming the corner.

A feature of the invention which assists in attaining greater plasma density uniformity is that there is different spacing, relative to the plasma, in a direction at right angles to a treated workpiece surface of the additional coil structure and the main coil part. Preferably, the additional coil structure is closer to the plasma than the main coil part.

In certain embodiments, the adjacent conductor segments abut to form a corner and the additional structure includes a conductor segment spatially adjacent the corner and electrically connected in parallel with the conductor segments forming the corner. In other embodiments, the adjacent conductor segments are spaced almost to form a corner and the additional structure includes a conductor segment spatially adjacent the corner and electrically connected in series with the adjacent conductor segments almost forming the corner.

In an additional aspect of the invention the coil has plural electrically conducting windings, each having sufficient length at the frequency of the RF field to have transmission line effects so there is a peak standing wave RF current therein and each winding includes different portions having differing spacings from the plasma in a direction at right angles to a face of the workpiece exposed to the plasma. The combination of such plural parallel windings and the different spacings enables spatial tailoring of RF field density supplied to the plasma. The peak standing wave current can be located at a position along each winding that is close or remote from the portion of each winding closest to the plasma, depending on the plasm flux density situation in a particular vacuum chamber. For example, to achieve plasma flux uniformity it is usually desirable for the peak standing wave currents in the different windings and the portion of each winding closest to the plasma to differ. However, in other situations it may be desirable for the maximum standing wave current to be in the portion of each winding closest to the plasma. The plural parallel windings enable (1) plural maximum standing wave currents to be provided at different spatial parts of the coil for control of RF field densities in different parts of the plasma and (2) control of these plural maximum standing wave currents relative to the portions of the windings having different spacings from the plasma. These two effects provide substantial control of RF field densities in different parts of the plasma and control of the plasma flux density incident on the workpiece. The control is enhanced in a spatially symmetrical coil, e.g., a coil having plural interlaced windings, such as windings having spiral-like configurations.

According to an additional aspect of the invention the coil has peripheral and other non-peripheral conducting segments and a conductor segment connected electrically only to the peripheral portion of the coil and located spatially close to the peripheral portion of the coil. The peripheral portion of the coil and the conductor segment are arranged so RF fields established by them add in a portion of the plasma to increase the plasma flux density in the portion of the plasma.

In a further aspect of the invention, the coil includes first and second electrical conducting portions connected electrically in series. The first and second conducting portions are in spatially different parts of the coil. The coil includes a conductor segment connected electrically in parallel with only the first conducting portion and located spatially close to the first conducting portion. The first conducting portion and the conductor segments are arranged so RF fields established by them add in a portion of the plasma to increase the plasma flux density in the portion of the plasma.

In an added aspect of the invention, the coil has first and second conducting segments having spatially close ends spaced from each other by a gap. A third conducting segment is connected electrically in series with the ends of the first and second conducting segments and is spatially close to the first conducting segment. The first and third conducting segments are arranged so RF fields established by them add in a portion of the plasma to increase the plasma flux density in the portion of the plasma.

According to a further aspect of the invention, the coil includes first and second electrical conducting portions that are connected electrically in series, but are in spatially different parts of the coil. The coil includes a conductor segment connected electrically in parallel with only the first conducting portion and located spatially close to the first conducting portion. The first conducting portion and the conductor segments are arranged so RF fields established by them add in a portion of the plasma to increase the plasma flux density in the portion of the plasma.

According to a still further aspect of the invention, the coil includes first and second conducting segments having spatially close ends spaced from each other by a gap. A third conducting segment is connected electrically in series with the ends of the first and second conducting segments and is spatially close to the first conducting segment. The first and third conducting segments are arranged so RF fields established by them are in a portion of the plasma to increase the plasma flux density in the portion of the plasma.

According to yet another aspect of the invention, the coil includes center and other portions each having a number of winding turns, wherein the turns of the center portion have a tighter pitch than the turns of the other portion. The turns of the center and other portions are connected to each other and are spatially arranged such that there is significant self coupling of an RF magnetic field derived by the center portion without substantial cross coupling of the RF magnetic field derived by the center portion with RF magnetic fields derived from the other portions of the coil.

The above and still further objects, features and advantages of the present invention will become apparent upon consideration of the following detailed descriptions of several specific embodiments thereof, especially when taken in conjunction with the accompanying drawings.

BRIEF DESCRIPTION OF THE DRAWING

FIGS. 5A and 5B are, respectively, two-dimensional plots of silicon etch rate for two flat panel glass plates excited by the coils of FIGS. 1 and 4;

DESCRIPTION OF THE PREFERRED EMBODIMENTS

Figure 1:
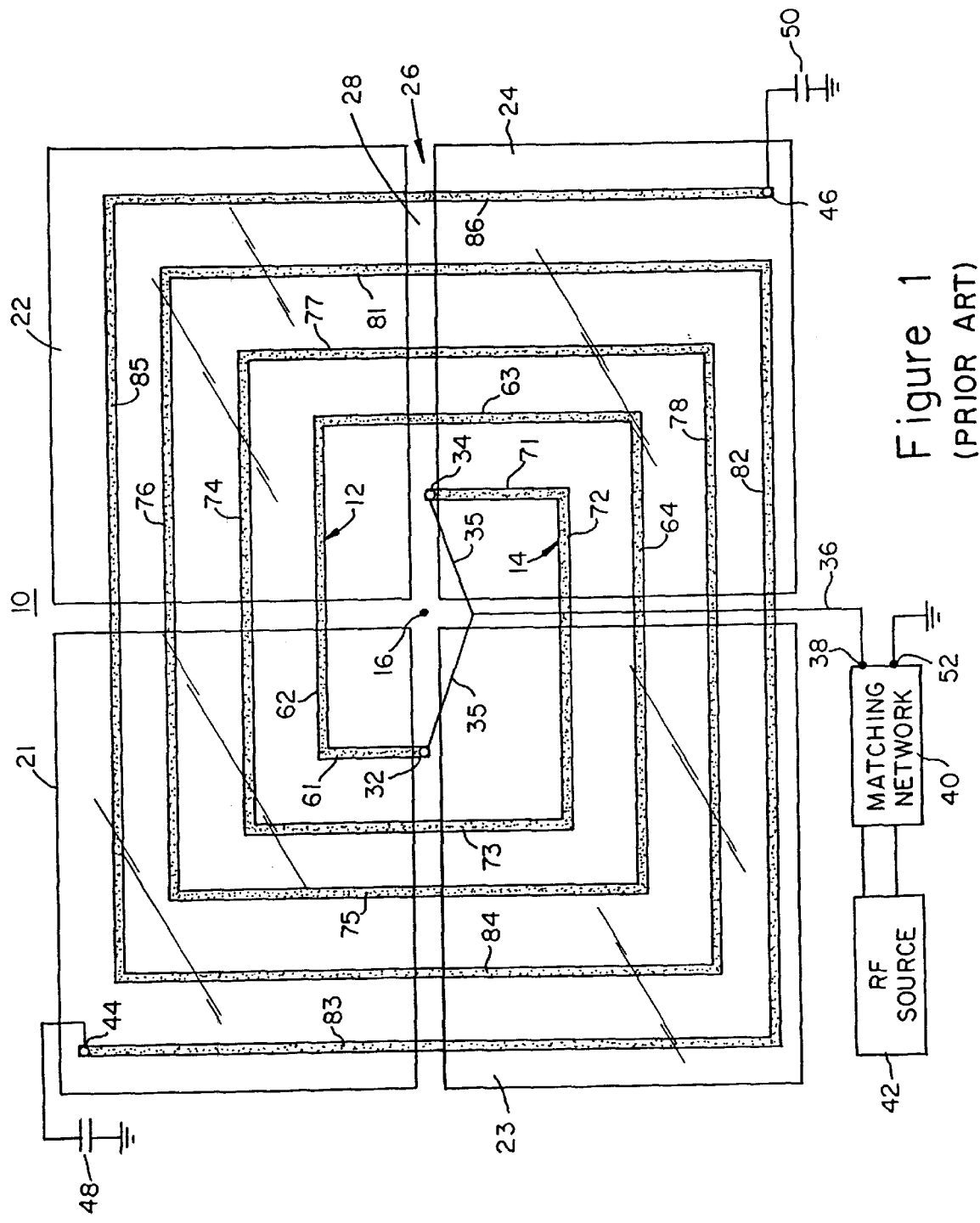
FIG. 1, as previously described, is a bottom view of a prior art substantially planar coil, in combination with four self supporting windows, of a vacuum plasma processor for relatively large area workpieces, particularly flat panel displays.
Figure 2:
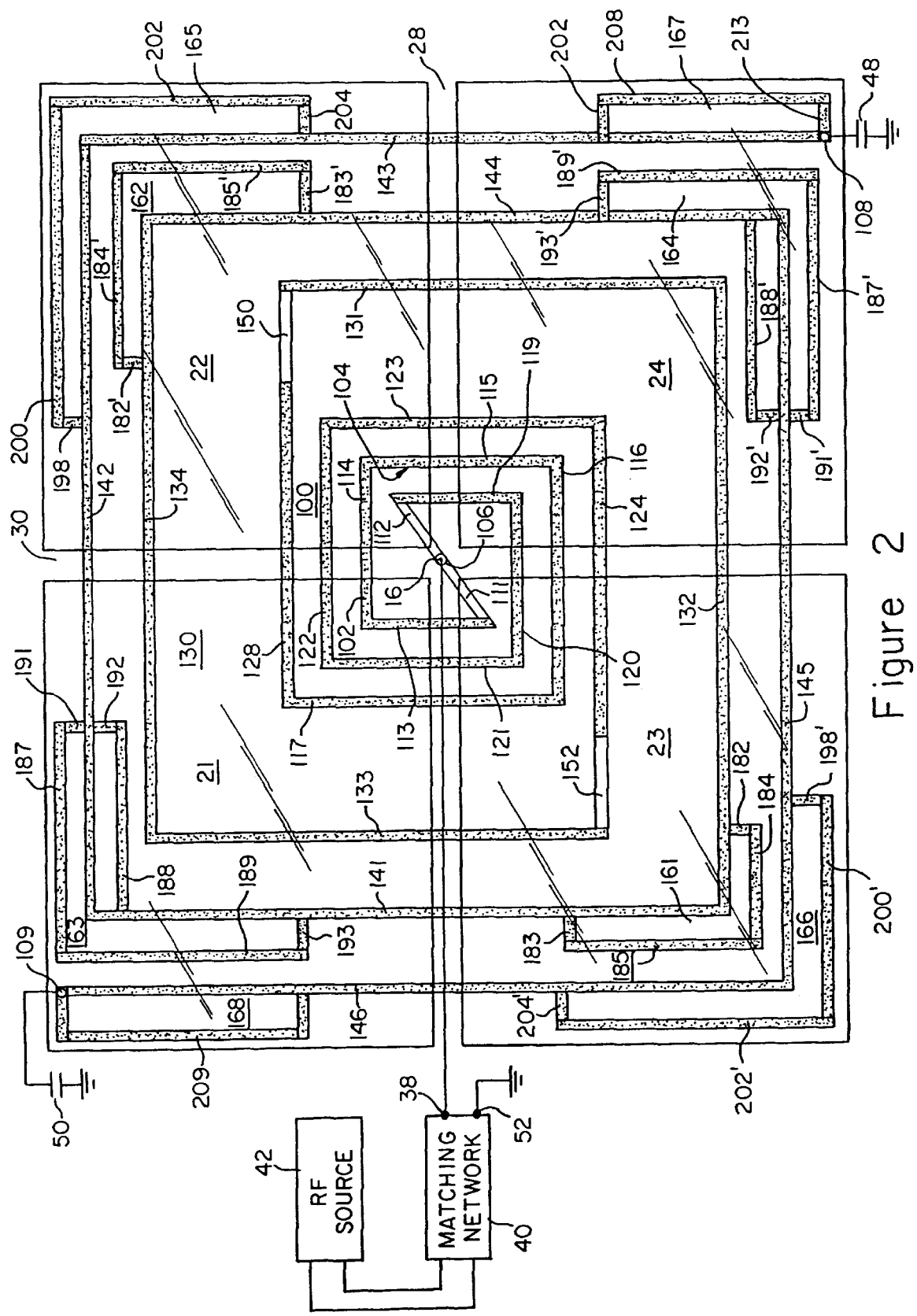
FIG. 2 is a bottom view of a modified coil in accordance with one embodiment of the present invention, in combination with four self-supported windows.

Reference is now made to FIG. 2 of the drawing, wherein the prior art coil of FIG. 1. is modified to include (1) an intermediate portion for coupling a substantially lower magnetic flux density to the intermediate portion of the plasma flux incident on the workpiece relative to center and peripheral portions of the coil and (2) a peripheral portion having additional metal conducting segments for adding magnetic flux to the plasma. The added magnetic flux supplements magnetic flux supplied to the plasma by a main part of the coil, i.e., the part of the coil not including the additional segments, to increase the magnetic flux density in the plasma peripheral portions, whereby the magnetic plasma flux density at a rectangular workpiece exposed face becomes more uniform. In FIG. 2, the additional segments are connected in parallel with the main part of the coil.

Coil 100 of FIG. 2 has a rectangular periphery that is similar in shape and slightly larger in size than the workpiece; the processor of the figures processes rectangular workpieces, preferably cross flat panel displays. Coil 100 includes two electrically parallel windings 102 and 104, electrically connected to ungrounded and grounded output terminals 38 and 52 of matching network 40, in turn responsive to 13.56 MHz RF source 42. Windings 102 and 104 have a common central terminal 106, coincident with coil center point 16, about which all of coil 100 is substantially diagonally (and therefore diametrically) symmetrical. Terminal 106 is connected by an electrically conductive strap (not shown) to matching terminal output terminal 38. Windings 102 and 104 include diagonally opposed peripheral terminals 108 and 109, at opposite peripheral corners of coil 100.

Terminals 108 and 109 are respectively connected to grounded terminal 52 of matching network 40 via capacitors 48 and 50. Each of windings 102 and 104 has an electrical length for the frequency of source 42 such that transmission line effects occur in the windings. The lengths of windings 102 and 104 and the frequency of source 42 are usually such that the distance along each winding is slightly less than a half wavelength of the source frequency. The values of capacitors 48 and 50 are selected so peak and minimum standing wave currents respectively occur in the peripheral and interior portions of the windings. In one embodiment, the peak standing wave currents occur approximately at the point of the outermost turns of windings 102 and 104 which are approximately aligned with rail 30 that support windows 21–24 and the minimum standing wave currents are approximately at terminal 106, where the standing wave voltage has a peak value. Because the maximum standing wave current occurs about ⅜ of a turn from each of terminals 108 and 109, relatively large magnetic flux densities are imparted by the main peripheral part of coil 100 to the peripheral portion of the plasma incident on the peripheral portion of the workpiece.

Coil 110 includes (1) a three turn central portion 112 (including straight metal conducting segments 113–124, extending radially and circumferentially from center terminal 106 to which they are electrically connected by metal struts 111 and 112), (2) approximately one turn intermediate portion 130 (including straight radially and circumferentially extending metal conducting segments 131–134), and (3) approximately two turn peripheral portion 140 (including straight radially and circumferentially extending metal conducting segments 141–146). The turns of peripheral portion 140 have a substantially greater pitch than the single turn 132 of intermediate portion 130, which in turn has a pitch considerably greater than the tightly pitched turns of center portion 110. Intermediate portion 130 is substantially radially displaced from center portion 110, but is somewhat radially close to peripheral portion 140.

Each of the coplanar straight metal conducting segments 113–124, 131–134 and 141–146 of portions 110, 130, 140 is preferably formed of copper having a square cross-section of approximately 1.25 cm on each edge and is spaced so its bottom edge is approximately 3 cms above the top faces of windows 21–24, having bottom faces about 10 cms above the planar processed workpiece surface. The windings of coil 100 are suspended by dielectric hangers from the ceiling of a non-ferrous metal (preferably anodized aluminum) coil shielding cover of a type disclosed in the Barnes et al. patent. The exterior ends of center coil portion 110 are electrically connected by metal, preferably copper, struts 150 and 152 to the interior ends of intermediate coil portion 120. To minimize the amount of magnetic flux coupled by struts 111, 112, 150 and 152 to the plasma beneath the windows, the struts have an inverted U shape, with a first leg lying in a plane appreciably above the plane of the straight conducting segments of portions 110, 130 and 140 and two downwardly depending legs electrically and mechanically connecting the first leg to coil 100. The struts have a 0.3×2.5 cm cross section with the 2.5 cm edge being parallel to windows 21–24.

The coil of FIG. 2 is designed so there is a greater current density in the center and peripheral coil portions 110 and 140 than in intermediate coil portion 130. Thereby the magnetic flux densities derived from the center and peripheral coil portions are greater than the magnetic flux density derived from the intermediate coil portion. Consequently, the tendency of the plasma flux density incident on the workpiece in the vacuum chamber to be greater in the intermediate portions of the workpiece than in the center and peripheral portions of the workpiece is reduced. The plasma flux density in the center portion of the prior art processor including the coil of FIG. 1 has a tendency to be relatively low because the plasma has a tendency to diffuse away from the center portion of the plasma. The tendency in the prior art of the plasma flux density to be relatively low in the peripheral portions of the plasma occurs because the plasma generated by the prior art coil has a maximum plasma flux density in a ring-shaped region at some intermediate distance between the center and the periphery of the coil. To establish the required plasma flux density at the center of the workpiece, the distance between the top of the workpiece and the underside of the dielectric windows must be sufficiently large as to allow for plasma diffusion. The plasma diffusion causes the ring-shaped region to average out into a more uniform plasma flux density at the workpiece. However, the relatively large distance between the workpiece and the underside of the window cannot be efficiently used when processing large area workpieces since the increase in distance between the workpiece and the windows causes the decrease in plasma flux density at the peripheral corner regions of the workpiece to be even more severe. The coil of FIG. 2 improves the plasma flux density over the prior art by supplying (1) more magnetic flux density to the center plasma portions than to the intermediate plasma portions and (2) additional magnetic flux density to the periphery of the plasma to at least partially overcome the effects of the shielding structure. The improved results occur because, inter alia, the center and peripheral portions 110 and 140 of coil 100 have a greater number of turns than intermediate portion 130.

In one embodiment, the turn of intermediate portion 130 is spaced from the exterior turn of center portion 110 such that the diameter of the intermediate portion turn is approximately twice the outer diameter of the center portion exterior turn. In other words, the single turn of intermediate portion 130 circumscribes an area which is approximately four times the area circumscribed by the three turns of center portion 110 and the single turn of the intermediate portion is spaced from center point 16 by twice the distance that the exterior turn of center portion 110 is spaced from the coil central point. The single turn of intermediate portion 130 is spaced from the turns of peripheral portion 140 by about the same distance that the turns of the peripheral portion are spaced from each other in the coil of FIG. 2. In particular, straight conductor segments 131–134 are spaced from straight conductor segments 141–145 by approximately the same distance that straight conductor segments 141 and 144 are spaced from straight conductor segments 146 and 143, respectively.

The thus tightly pitched center coil portion 110 and its somewhat remote spacing from intermediate coil portion 130 help to overcome the tendency for a relatively low plasma flux density to be incident on the center of the workpiece. The tight pitch of center coil portion 110 and its separation from the rest of coil 100 cause close self coupling of the magnetic flux derived from the center coil portion to concentrate the magnetic flux (i.e. increase the magnetic flux density) derived from center portion 10.

To attain the desired substantially uniform plasma flux density over the entire workpiece, peripheral coil portion 140 is modified relative to the prior art coil of FIG. 1. In other words, the main portion of the coil of FIG. 2 (consisting of conductor segments 113–128, 131–134 and 141–146, as well as struts 111, 112, 150 and 152) has additional structure added to its periphery to increase the magnetic flux density in the periphery of the plasma, particularly the parts of the plasma close to corners of the rectangular processing chamber.

In the embodiment of FIG. 2, peripheral coil portion 140 includes additional electrically conducting winding segments 161–168, spatially adjacent to the four peripheral corners of the coil peripheral terminals 108 and 109. The odd numbered ones of winding segments 161–168 are part of and added to winding 102, while the even numbered ones of winding segments 161–168 are part of and added to winding 104. Winding segments 161–168 are coplanar with conductor segments 113–124, 131–134 and 141–146 and cause additional RF current to flow in the peripheral portions of coil 100, particularly at the corners of the coil where the magnetic and plasma flux densities have a tendency to be otherwise relatively low. The RF current flowing in winding segments 161–168 adds magnetic flux to the corners of the plasma processing chamber. The magnetic flux added by segments 161–168 to the processing chamber aids the magnetic flux supplied to the processing chamber by conductor segments 141–146 of the main coil portion to increase the plasma flux density below the corners of the coil and overcome to a large extent the non-uniformity of the plasma flux density at the corners of the rectangular workpiece and vacuum chamber. The magnetic fluxes established by the straight intersecting conductor segments 141–146 (which form 90° corners) have longitudinal axes substantially at right angles to each other and bend around the corners of the coil, vacuum chamber and workpiece; the magnetic fluxes established by segments 161–168 have axes extending generally in the same direction as the straight segments 141–146 with which they are spatially adjacent and electrically connected in parallel.

In the preferred embodiment illustrated in FIG. 2, each of added, diagonally opposed coil segments 161 and 162 includes four straight, mutually perpendicular copper conductor segments 182–185. Conductor segments 184 and 185 of coil segment 161 respectively extend parallel to and are positioned outwardly from (by the same distances) straight segments 132 and 141, with segment 184 extending from the corner intersection of segments 132 and 141 by a smaller distance than segment 185. Segments 184 and 185 are respectively connected to segments 132 and 141 by stub segments 182 and 183. Segment 162 has a geometry identical to that of segment 161, but is at the corner defined by intersecting straight line segments 134 and 144.

Each of winding segments 163 and 164, respectively at and electrically connected in parallel with the corners defined by the intersection of conductor segments 141 and 142 and the intersection of conductor segments 144 and 145, has a substantially larger area and more conductors than segments 161 or 162. Consequently, winding segments 163 and 164 add more magnetic flux density to the plasma flux close to the wall of the vacuum plasma processing chamber than is added by winding segments 161 and 162. Winding segment 163 includes two electrically and spatially parallel conductor segments 187 and 188, respectively positioned outwardly and inwardly of and extending parallel to conductor segment 142. Segment 187 is connected in series with conductor segment 189 that is positioned outside and extends parallel to conductor segment 141; segments 187 and 189 have about the same length that is somewhat greater than the length of segment 188. Electrical parallel connections from main coil conductor segments 141 and 142 to parallel conductor segments 187–189 are established by stub conductor segments 191–193, extending at right angles to the conductor segments 141, 142 and 187–189 with which they are physically connected. Corner winding segment 164, constructed identically to corner winding segment 163, is diametrically opposite from segment 163 and intersects straight conductor segments 144 and 145 at the corner formed by them.

Each of additional diagonally opposed winding segments 165 and 166, respectively at and electrically connected in parallel with the corners defined by the intersection of conductor segments 142 and 143 and the intersection defined by conductor segments 145 and 146, includes conductor segments 198, 200, 204 and 206. Segments 198, 200, 202 and 204 provide parallel current paths slightly outside the corners associated with them. The end of conductor segment 198 remote from the corner is closer to center rail 30 than is the corresponding conductor segment 183 of winding segment 162, to further increase the magnetic flux density close to the wall of the vacuum plasma processing chamber.

Winding segments 167 and 168, respectively at and electrically connected in parallel with the diagonally opposed peripheral corners where end terminals 109 and 108 are located, respectively include elongated conductor segments 208 and 209 that extend parallel to and are slightly outside of conductor segments 143 and 146. Segments 208 and 209 are respectively connected by stub straight conductor segments 212 and 213 to conductor segments 143 and 146. The magnetic fluxes of segments 167 and 168 aid the magnetic fluxes of segments 143 and 146 to increase the peripheral plasma flux density.

The outer edges of each of the outer conductors of additional peripheral winding segments 163–168, i.e. conductors 187, 187', 200, 200', 202, 202', 208 and 209, are set back slightly from the outer edges of windows 21–24 so the magnetic flux derived by these conductors is effectively added to the plasma. (In FIGS. 2–4, corresponding parts of opposite peripheral winding segments bear the same reference numerals except that primes are added to the peripheral winding segments that are not specifically described.) The magnetic flux resulting from the current flowing through segments 161–168 is added to the magnetic flux resulting from the current flowing in the main part of the coil. The additional magnetic flux increases the magnetic flux at the periphery of the vacuum plasma processing chamber, particularly in the corners of the chamber, to increase the plasma flux density in the peripheral portions of the workpiece so the plasma flux density incident on the workpiece is more uniform than the prior art of FIG. 1.

Figure 3:
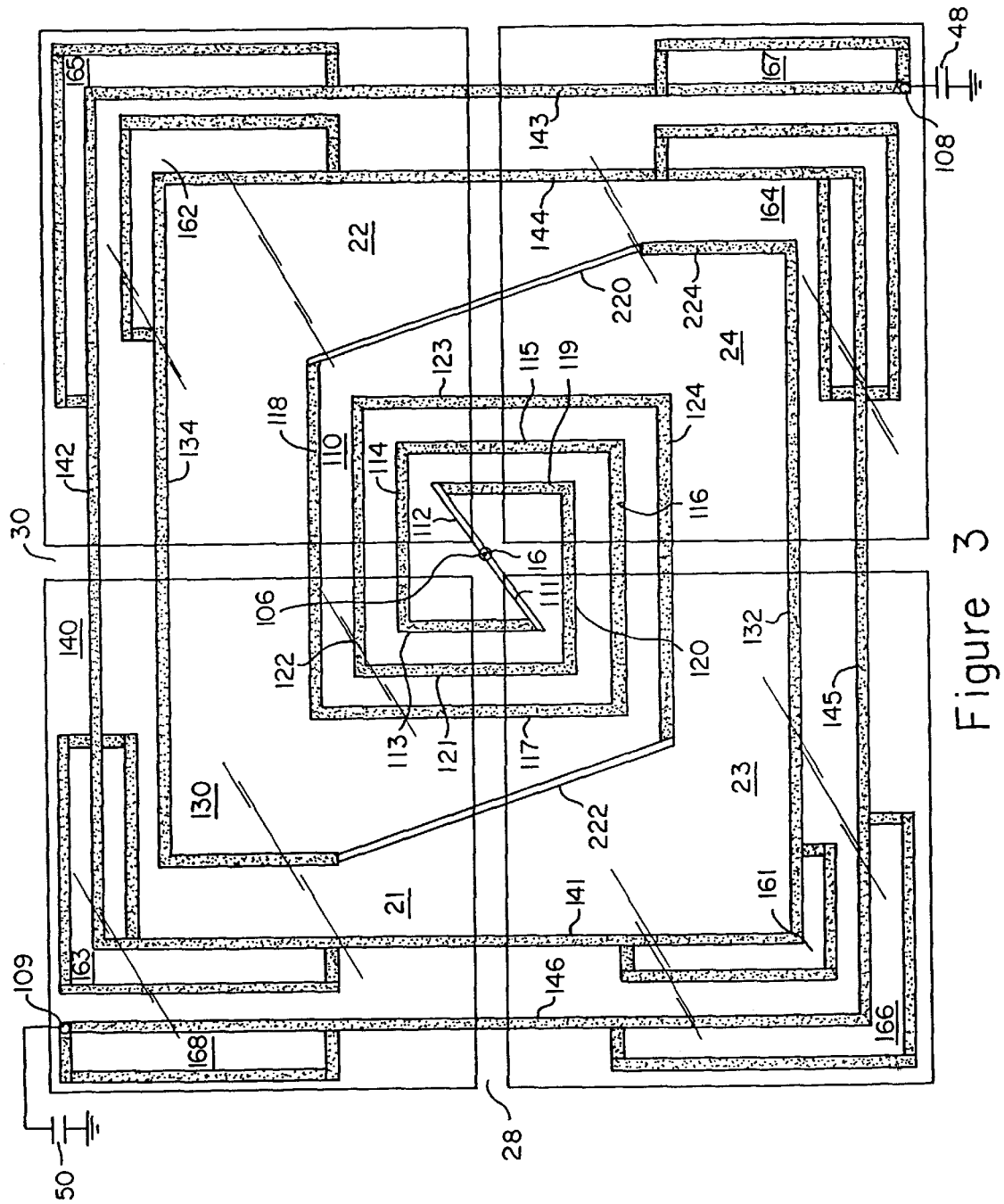
FIG. 3 is a bottom view of a further embodiment of a coil in accordance with the present invention, in combination with four self-supported windows.

It was found that greater plasma density uniformity is achieved by the coil illustrated in FIG. 3 than is attained with the coil of FIG. 2. In the coil of FIG. 3 intermediate coil portion 130 is modified relative to the FIG. 2 embodiment by replacing metal, electrically conducting struts 150 and 152 and conductors 131 and 133 with metal, electrically conducting struts 220 and 222 and coil straight conducting portions 224 and 226. Conducting portions 224 and 226 have the same cross-sectional dimensions as the remaining conductors of the coils of FIGS. 2 and 3 and are coplanar with the remaining conductors of the coil of FIG. 3. Struts 220 and 222 have the same dimensions and geometrical orientation as struts 150 and 152, being shaped as inverted U's. Thereby, a negligible amount of magnetic flux is added to the plasma by struts 220 and 222.

Conducting segments 224 and 226 extend parallel to rail 30, inwardly from conducting segments 132 and 134, respectively. The length of each of conducting segments 224 and 226 is less than one half the spacing of conducting segments 132 and 134 from rail 28. Thereby, the end of each of conducting segments 224 and 226 remote from conducting segments 132 and 134 is substantially outside the exterior turn of internal coil portion 110. Struts 220 and 222 extend from the end terminals of the interior coil portion 110 to the ends of coil portions 224 and 226 remote from coil segments 132 and 134, respectively.

The foregoing differences between the coils of FIGS. 2 and 3 cause the coil of FIG. 3 to have greater isolation of the magnetic flux established by center coil portion 110 than the FIG. 2 embodiment. As a result, there is a greater center magnetic flux density in the embodiment of FIG. 3 than in the coil of FIG. 2. Further, the magnetic flux density in the intermediate portion of the coil of FIG. 3 is less than in the coil of FIG. 2. The magnetic flux patterns derived from the coils of FIGS. 2 and 3 in peripheral core portions 140 are substantially the same. All of these factors cause the plasma flux density excited by the coil of FIG. 3 to be more uniform than the plasma flux density excited by the coil of FIG. 2.

Figure 4:
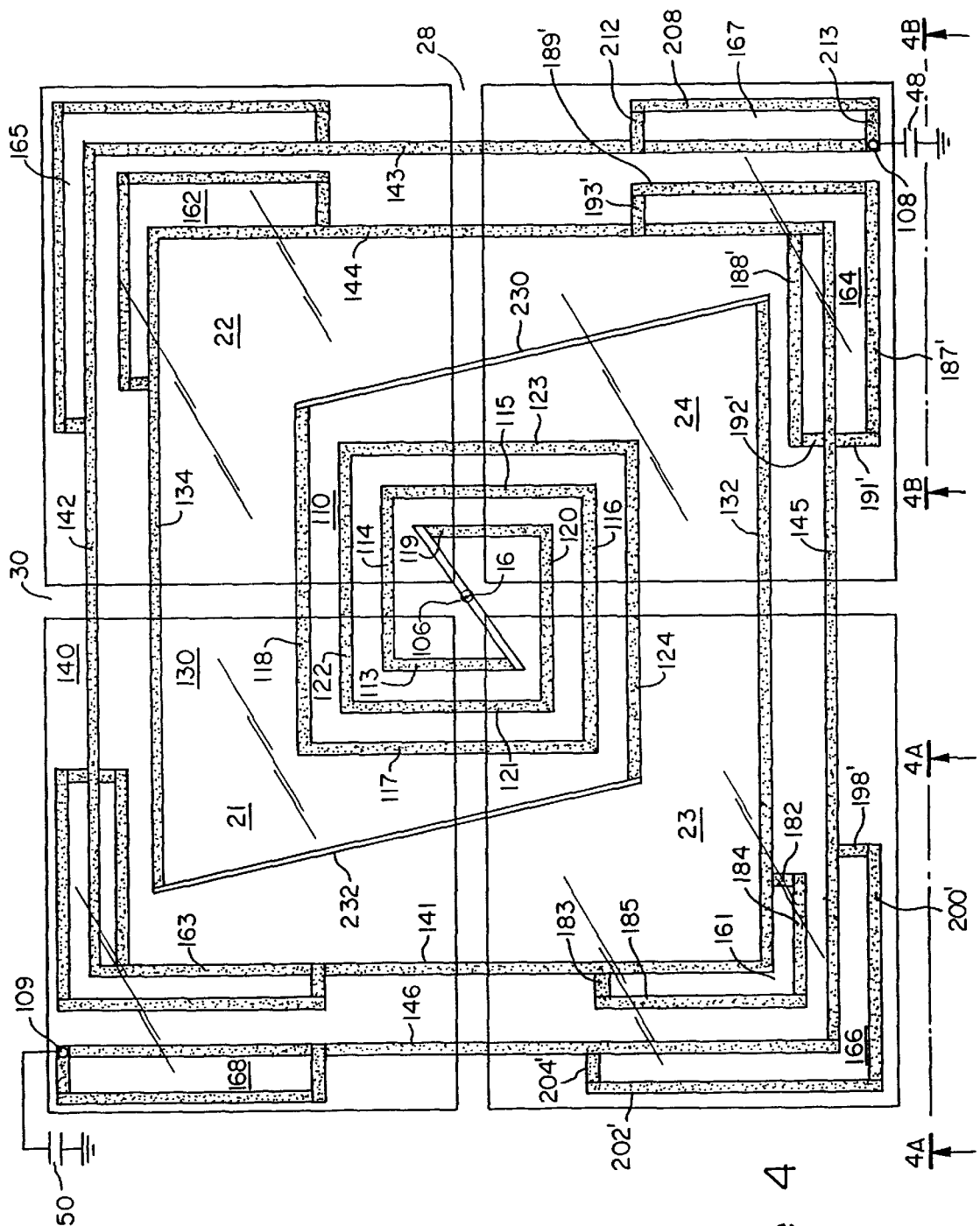
FIG. 4 is a bottom view of a further coil in accordance with the present invention, in combination with four self-supported windows.
Figure 4A:
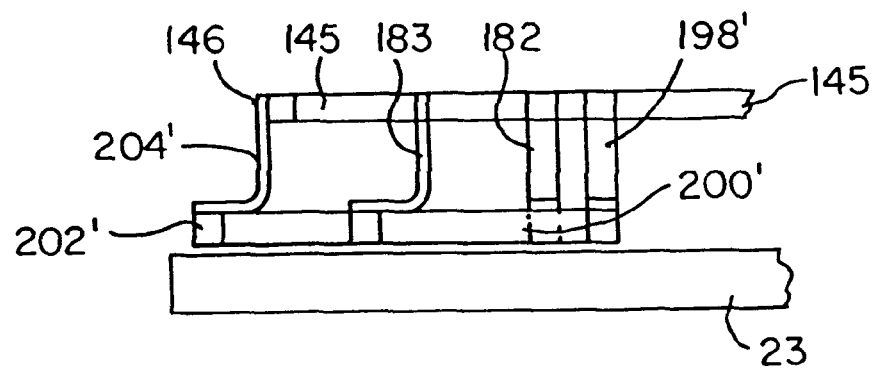
FIGS. 4A and 4B are side views of portions of the coil illustrated in FIG. 4.
Figure 4B:
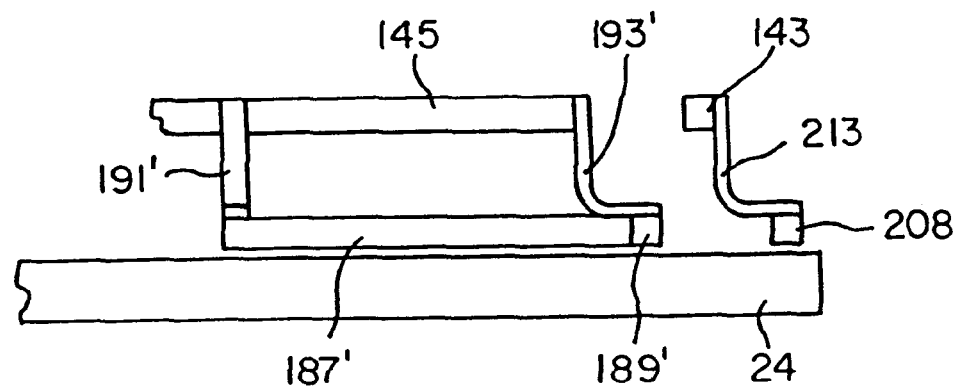

According to a further embodiment, illustrated in FIGS. 4, 4A and 4B, the coil of FIG. 3 is modified to (1) eliminate conductor portions 224 and 226 and (2) locate the additional peripheral parallel coil segments 161–168 so they are closer to the plasma than the remaining conducting coil segments.

In the coil of FIG. 4, intermediate coil portion 130 is modified to include only approximately one half of conductors 132 and 134, i.e., coil portion 130 includes only the part of conductor 132 to the right of rail 30 and the part of conductor 134 to the left of rail 30 (as viewed in FIG. 4). In FIG. 4, conducting portions 224 and 226 of FIG. 3 are completely eliminated and the ends of conductors 132 and 134 are electrically connected to end terminals of center coil portion 110 by metal inverted U shaped struts 230 and 232. Struts 230 and 232 are very similar to struts 220 and 222, except struts 230 and 232 are connected directly to the ends of conductor segments 132 and 134 of coil center portion 110. Consequently, the magnetic flux density in the intermediate part of the plasma is lower for the coil of FIG. 4 than for the coils of FIGS. 1–3.

In the coil of FIG. 4, parallel peripheral segments 161–168 are not coplanar with the conducting segments 113–124, 132, 134 and 141–146 of the main part of the coil. Instead, the parts of the parallel peripheral segments that supply the greatest amount of magnetic flux to the plasma are closer to the plasma as a result of these parallel peripheral coil segments being much closer to the top face of windows 21–24 than are the conducting segments of the main part of the coil. Each of parallel peripheral segments 161–168 of the coil of FIG. 4 includes a straight conducting segment that is close to the plane of windows 21–24. The conducting segments in different planes are mechanically and electrically connected to each other by metal straps having cross sectional dimensions similar to struts 230 and 232. As illustrated in FIGS. 4A and 4B, the metal straps extend downwardly from the conductor segments in the main plane of the coil, thence horizontally to the conductor segments of parallel segments 161–168.

In the coil of FIG. 4, the bottom faces of parallel conducting segments 184, 185, 184', 185', 187, 188, 189, 187', 188', 189', 200, 202, 200', 202', 208 and 209 are close to the upper faces of dielectric windows 21–24. These conducting segments close to windows 21–24 are mechanically and electrically connected, as appropriate, to conducting segments 141–146 by metal straps 182, 183, 182', 183', 191, 192, 193, 191', 192', 193', 198, 204, 198', 204', 206, 207, 206', 207', 212, 213, 212' and 213' that extend parallel to and at right angles to the plane of windows 21–24.

Because conducting segments 184, 185, 184', 185', 187, 188, 189, 187', 188', 189', 200, 202, 200', 202', 208 and 209 close to windows 21–24 are adjacent to the periphery of the plasma, these conducting segments couple greater RF excitation power to the plasma corners than is achieved with the coplanar parallel peripheral segments of FIGS. 2 and 3. The increased RF excitation occurs because of the increased magnetic field density resulting from the closer proximity of the conducting segments close to windows 21–24 than the coplanar parallel peripheral conducting segments of FIGS. 2 and 3. In addition, the closer proximity of the parallel conducting segments of FIG. 4 enables significant electrostatic, i.e., capacitive, coupling of the coil RF field to the plasma. In the coils of FIGS. 2 and 3, the amount of electrostatic coupling from all portions of the coil to the plasma is quite small because of the substantial separation between the plasma and the coil. As a result of these effects, there is an appreciable increase in the plasma flux density in the peripheral region of the plasma when the plasma is responsive to the coil of FIG. 4, relative to the coils of FIGS. 1–3.

Figure 5:
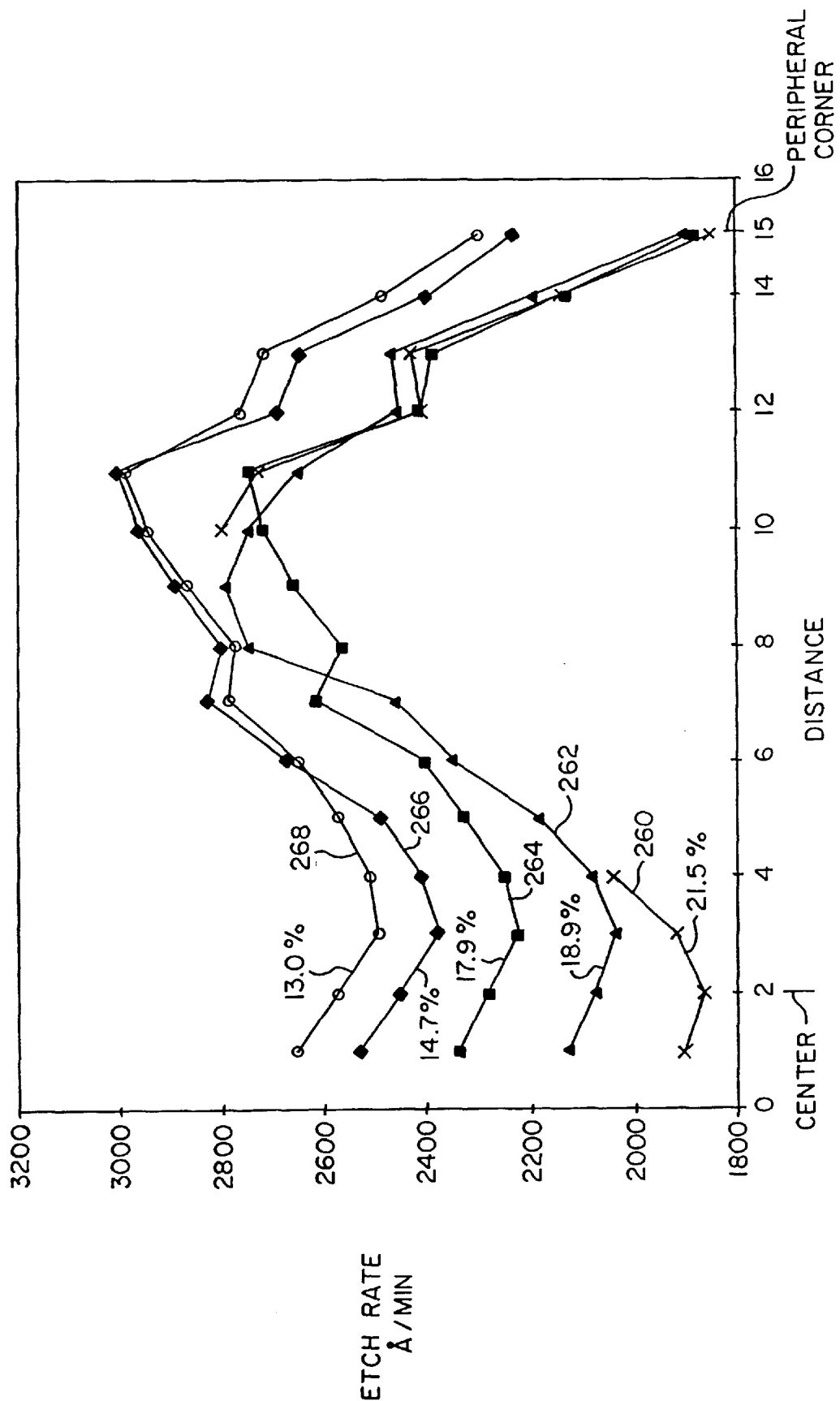
FIG. 5 includes a series of plots indicating a function of plasma flux density versus workpiece position for the coils illustrated in FIGS. 1–4.
Figure 6:
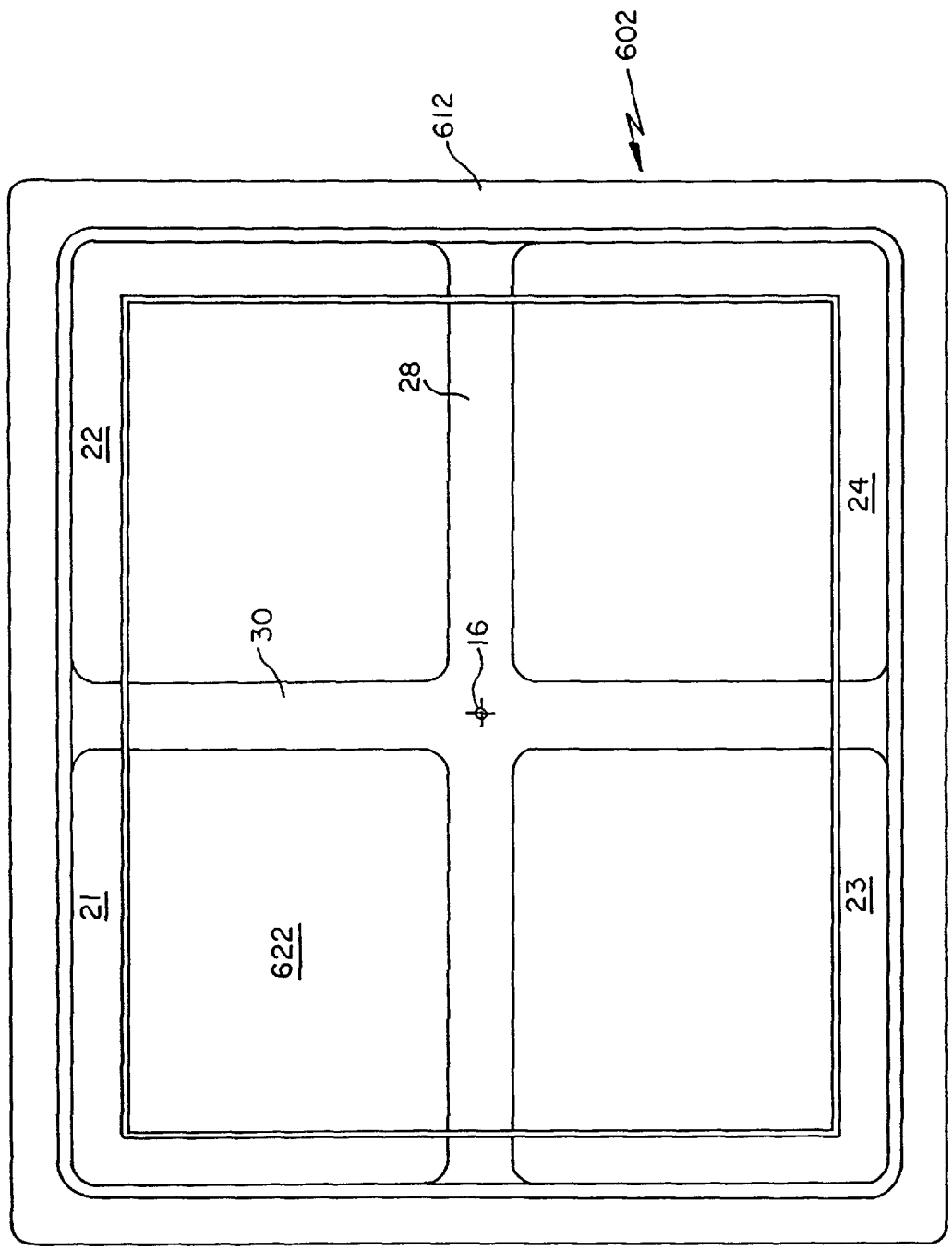
FIG. 6 is a view looking upwardly from the lines 6—6 in FIG. 7 through a workpiece in a vacuum plasma processor including the coil of FIG. 4, wherein the processor portion including the windows.
Figure 7:
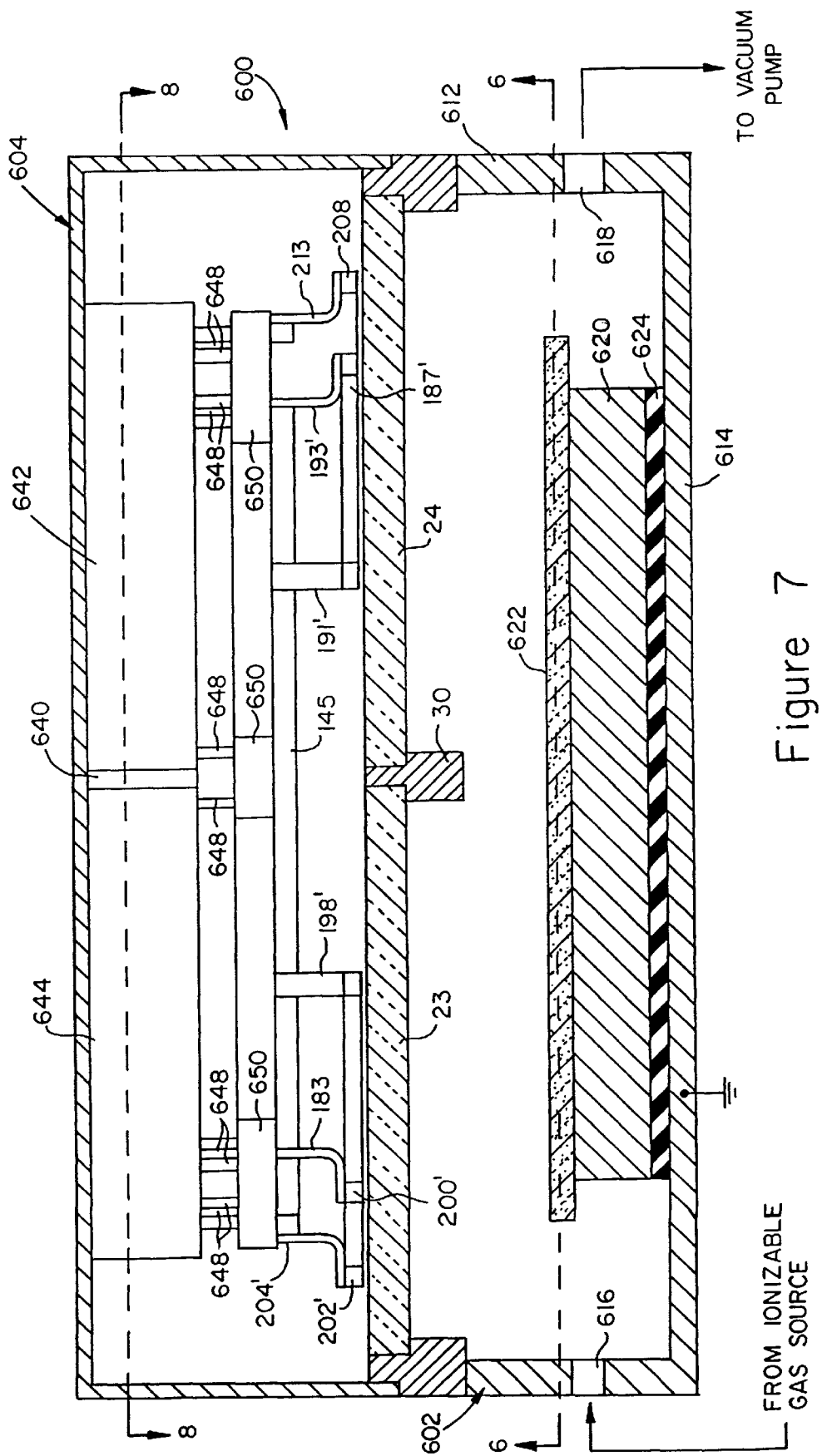
FIG. 7 is a side view of the interior of the vacuum plasma processor illustrated in FIG. 6.
Figure 8:
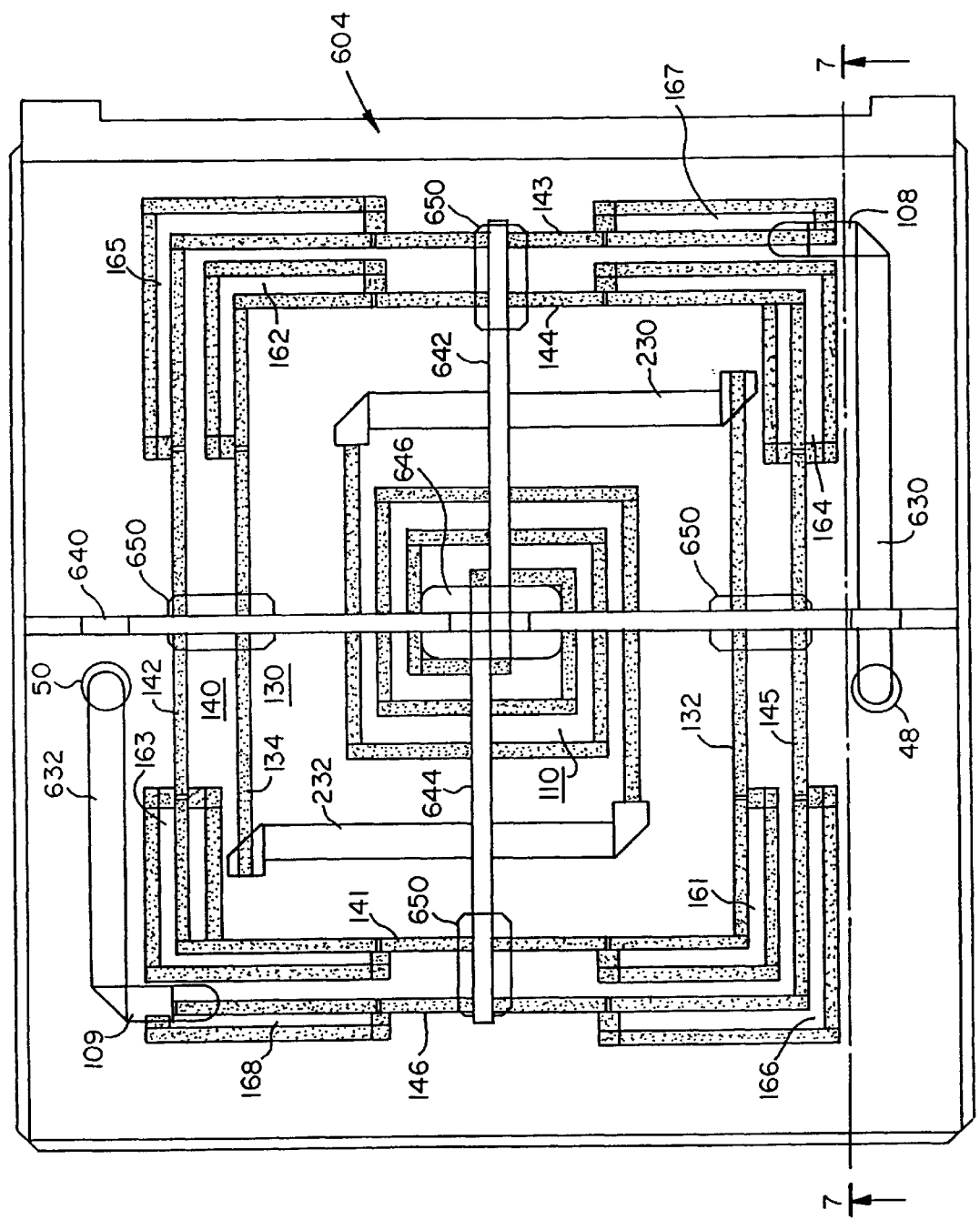
FIG. 8 is a view of the processor illustrated in FIGS. 6 and 7, looking downwardly from the lines 8—8 in FIG. 7.

Reference is now made to FIG. 5, including plots of silicon etch rate in Angstroms per minute from flat circular workpieces, each having an exposed surface uniformly coated with silicon; the workpieces were laid out along a diagonal of a plasma processing chamber having a rectangular shape, as described infra in connection with FIGS. 6–8. Since etch rate is directly dependent on plasma flux density the measurements of etch rate are directly correlated with plasma flux density. The etch rate is plotted for (1) the prior art coil of FIG. 1 (plot 260), (2) a coil having center, intermediate and peripheral portions as illustrated in FIG. 1, in combination with the peripheral parallel coil segments of FIG. 2 (plot 262), (3) the coil of FIG. 2 (plot 264), (4) the coil of FIG. 3 (plot 266) and (5) the coil of FIG. 4 (plot 268). Plots 260–266 were obtained from plasma processing chambers operating under the same conditions, to the extent possible and practical. Etch rate is indicated along the Y axis in FIG. 5, while distance along the diagonal of the workpiece surface is indicated in the X axis direction. The workpiece center and peripheral corner along the diagonal are respectively indicated by the numerics "2" and "15" in the X axis direction. The measurements presented in FIG. 5 indicate the plasma flux densities deviate from uniformity for the coils associated with plots 260, 262, 264, 266 and 268 by 21.5%, 18.9%, 17.9%, 14.7% and 13.0%, respectively.

FIG. 5 provides some interesting data about plasma flux density as a function of workpiece radial position. When etching with the prior art coil, represented by plot 260, a minimal etch rate of approximately 1,825 Angstroms per minute occurs at the center of the workpiece. For plots 262–268, however, the minimum values occur at point 3 along the X axis, i.e., at a point displaced from the workpiece center. The lack of symmetry indicated by plots 262–268 probably occurs because the magnetic flux densities derived from the coils of FIGS. 2–4 are not completely symmetrical as a result of added conductor segments 188 and 188'. The minimum value of plasma flux density in the workpiece center, indicated by plot 268, is substantially higher than the center etch rates of any of plots 262–266. Apparently, the greater magnetic flux isolation provided by the structure of FIG. 4 for center coil portion 110 relative to intermediate and peripheral coil portions 130 and 140 causes a substantial increase in the magnetic flux in the center of the plasma. Greater magnetic flux isolation occurs in the coil of FIG. 4 than in the coils of FIGS. 2 and 3 because (1) the conducting segments of intermediate portion 130 are shorter in FIG. 4 than in FIGS. 1–3 and (2) a significant part of peripheral portion 140 (viz: the conducting segments 184, 185, 184', 185', 187, 188, 189, 187', 188', 189', 200, 202, 200', 202', 208 and 209) is farther from portion 110 in FIG. 4 than in FIGS. 2 and 3. Moving the additional parallel conducting segments from the plane of the main coil close to the upper faces of windows 21–24 causes an appreciable increase in the peripheral etch rate. For example, the etch rates at the corners of plots 266 and 268 for the coils of FIGS. 3 and 4 are respectively approximately 2275 and 2315 Angstroms per minute at edge point 15 and are respectively approximately 2475 and 2550 Angstroms per minute at point 14, which is about 92% of the way from coil center point 16 to the outer corner of the coil. The etch rates in the intermediate part of the workpiece, between numerics 6 and 12 in the X axis direction of FIG. 5, are virtually the same for the coils of FIGS. 3 and 4, as indicated by plots 266 and 268. The etch rates indicated by plots 266 and 268 are substantially higher in the intermediate portion of the workpiece than are the etch rates for the coil of FIG. 2 (plot 264) and the unillustrated coil indicated by plot 262. Hence, greater plasma flux density is attained for the coils of FIGS. 3 and 4 than is attained for the embodiment of FIG. 2 and the unillustrated embodiment, even though the coils of FIGS. 3 and 4 have greater etch rate uniformity relative to the coil of FIG. 2, the unillustrated coil and the prior art.

FIGS. 5A and 5B are plots of silicon etch rate, in Angstroms per minute, under identical conditions, as far as practical, of two glass 600×720 mm flat panel display substrates uniformly coated with silicon in vacuum chambers respectively including the coils of FIGS. 1 and 4. The etch rates were measured at equally spaced matrix points on the panel; measurements adjacent the panel edges were made 15 mm from these edges. The deviations from uniformity dropped almost 100% from 21% for the prior art to 11% for the coil of FIG. 4. The decrease in average etch rate is attributed to more equal loading by the plasma of the coil of FIG. 4 than by the plasma of the coil of FIG. 1. There were significantly lower etch rates below the intermediate portion of the coil of FIG. 4 where considerably less magnetic flux is generated than in the coil of FIG. 1; in this regard, the etch rates of 1989, 1904, 2071, 2023, 2033, 2028, 2031, 1899, 1831, 1909, 2065 and 2000 resulting from the FIG. 1 coil are materially respectively reduced to 1700, 1629, 1595, 1578, 1755, 1668, 1765, 1710, 1712, 1645, 1724 and 1611 when the FIG. 4 coil was used.

Reference is now made to FIGS. 6, 7 and 8 of the drawing wherein the coil of FIG. 4 is illustrated as being included in a vacuum processor 600 including vacuum chamber 602 and electromagnetic shield cover 604, preferably formed of anodized aluminum. The exterior of vacuum chamber 602 is defined by windows 21–24, rails 28 and 30, anodized, aluminum sidewalls 610, and anodized aluminum floor 614. Sidewalls 610 include ports 616 and 618, respectively connected to an ionizable gas source and a vacuum pump (neither shown). The vacuum pump establishes appropriate vacuum conditions in chamber 602, enabling the ionizable gas flowing through port 616 to be excited by the electromagnetic field derived by the coil of FIG. 4 to be excited to a plasma state. Chamber 602 and cover 604 are mechanically and electrically connected to each other and to ground potential by appropriate contacts and provide a shield to confine the magnetic and electric fields derived by the coil. The shield reduces the RF field density derived from the coil so the magnetic and electric fields close to the shield are considerably lower than the fields toward the center of the plasma processor.

In vacuum processing chamber 602 is located electrostatic chuck 620 which holds workpiece 622 in situ while the workpiece is being processed; in one preferred use of the processor, substrate 622 is a rectangular glass substrate for an electrostatic display panel. Electrostatic chuck 620 is electrically isolated from the ground potential of metal cover 604, walls 610 and floor 614 by electric insulating sheet 624. DC voltage from a suitable source (not shown) is applied as a clamping potential to electrostatic chuck 620, which is also connected via a matching network to an RF source (not shown) that RF biases the electrostatic chuck and workpiece 622. In addition, the back face of workpiece 622 is preferably cooled by providing grooves in chuck 620. In the preferred configuration, ionizable gas is introduced into the interior of vacuum chamber 602 by a plenum or manifold mounted on windows 21–24; to simplify the presentation, such a plenum or manifold is not illustrated, as such structures are well known to those skilled in the art.

Chamber 602 and cover 604 are constructed such that processor 600 is configured as a right parallelepiped to accommodate rectangular glass flat panel display workpiece 622. It is to be understood, however, that the periphery of processor 600 is modified so the periphery of the processor is similar in size and shape to the workpiece periphery if the workpiece has other peripheral configurations.

As illustrated in FIGS. 6 and 8, the periphery of substrate 622 is slightly smaller than the periphery of the coil of FIG. 4, which is in turn slightly smaller than the combined periphery of windows 21–24. By dimensioning the processor and substrate 622 so the substrate periphery is only somewhat smaller than the rectangular area subtended by the interior of chamber 602, the efficiency of generating sufficient plasma flux at the large area workpiece is improved over the prior art of FIG. 1, to enable the power requirements of the RF sources energizing the coil of FIG. 4 and the biasing chuck 620 to be maintained at a relatively low level; in one embodiment, RF source 42 has an output power of 5 kW.

As illustrated in FIG. 8, capacitors 48 and 50 are mounted in the volume between the upper face of windows 21–24 and the top of cover 604 so the circular cross-sections thereof are parallel to the windows. Capacitors 48 and 50 are connected to output terminals 108 and 109 of the coil of FIG. 4 by copper struts 630 and 632, both of which extend parallel to rail 28, in a plane parallel to the upper faces of windows 21–24.

As illustrated in FIGS. 7 and 8, the coil of FIG. 4 is supported by a structure including electrical insulating, elongated bars 640, 642 and 644, suspended from the ceiling of cover 604. The main portion of the coil of FIG. 4 is mechanically connected to bars 640, 642 and 644 by electrical insulating vertically extending support posts 648, in turn mechanically connected to horizontally extending electrical insulating coil support plates 648 and 650. Plates 650 support peripheral portion 140 of the coil, and center coil portion 110 is supported by center post 646.

As illustrated in FIG. 7, the bottom faces of the peripheral, corner segments of the coil are slightly spaced from the top faces of windows 21–24; in FIG. 7, coil segments 189 and 209 are illustrated as being proximate the upper face of window 21 and are connected to coil segments 141 and 146 by curved struts 193 and 206', respectively. Coil segments 141 and 146 are in turn illustrated as being suspended from the bottom face of coil support face 650. In one preferred embodiment, the bottom faces of segments 189 and 209 are vertically spaced from the top face of window 21 by approximately 0.56 cm and the bottom faces of main coil segments 141 and 192 are vertically spaced by about 2.2 cm from the bottom faces of peripheral coil segments 189 and 209.

Figure 9:
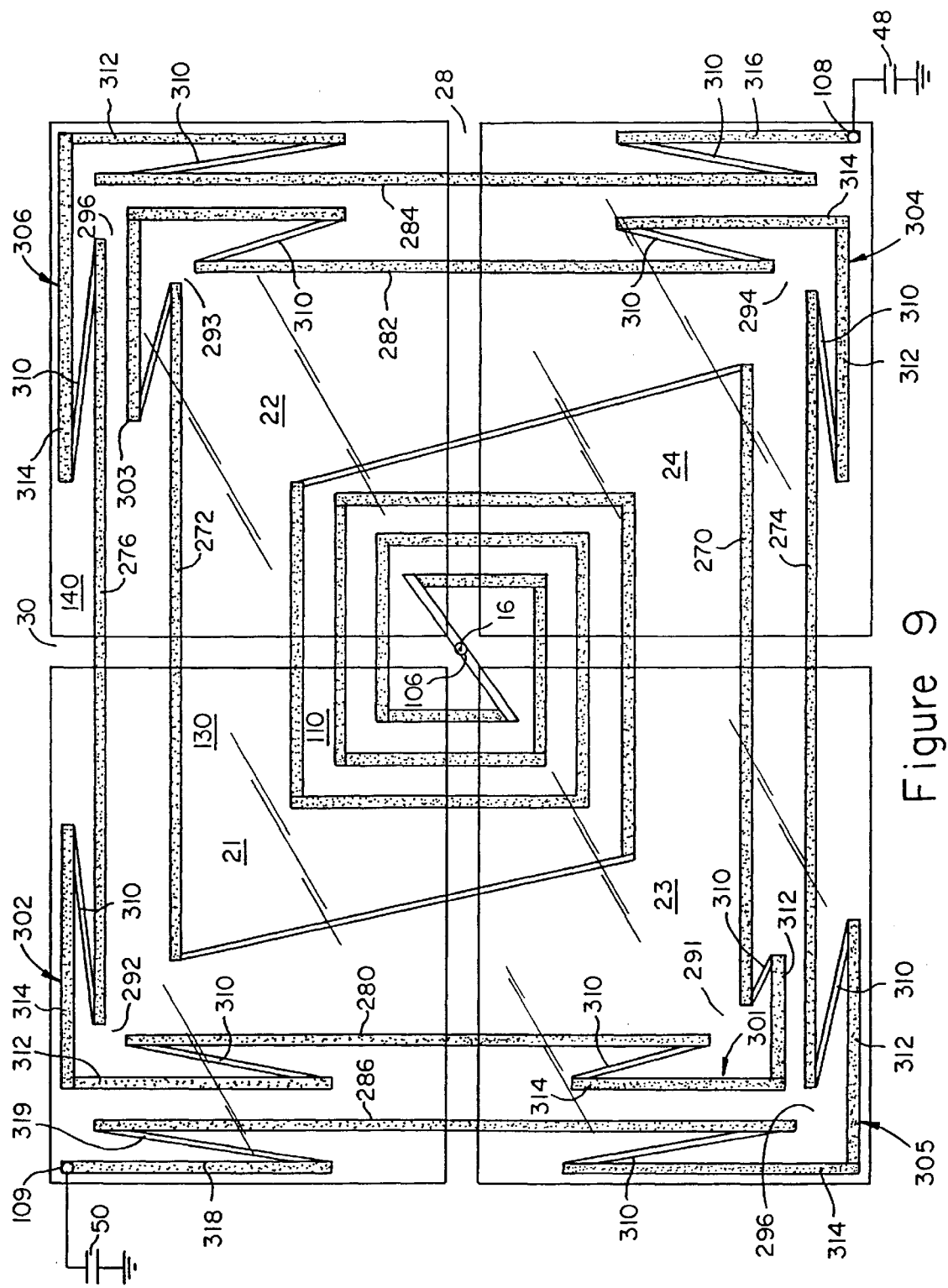
FIGS. 9 and 10 are further embodiments of two different coils in accordance with the invention, wherein each coil includes series segments connected to a main coil part.

A bottom view of a further coil in accordance with the present invention is illustrated in FIG. 9. In the coil of FIG. 9, the main part of the coil, which is similar in certain respects to the main parts of the coils of the embodiments of FIG. 2–4, has added to it peripheral segments that are connected in series with corners in the peripheral portions of the main part of the coil. The corners are formed by conducting segments that extend substantially at right angles to each other, having non-contacting adjacent ends that almost meet. The additional series conductor segments in the peripheral portion of the coil have current flowing in them in the same spatial direction as the spatially adjacent conducting elements so that the magnetic flux coupled by these additional conducting segments to the plasma is additive to the magnetic flux derived from the main part of the coil.

The coil of FIG. 9 includes center and intermediate portions 110 and 130 which are identical with the corresponding center and intermediate portions of the coil of FIG. 4. The peripheral portion 140 of the coil illustrated in FIG. 8 is, however, quite different from the coils of the embodiments of FIG. 2–4. The main part of the peripheral portion 140 includes straight conducting segments 270, 272, 274 and 276, each of which is parallel to rail 28, as well as straight conducting segments 280, 282, 284 and 286, each of which is parallel to rail 30.

None of straight conducting segments 270–276 and 280–286 are in direct contact. Instead, there is a gap at each of the four interior corners 291–294 and the two exterior corners 295 and 296 formed by a pair of adjacent ones of segments 270–276 and 280–286. A pair of supplemental, mutually perpendicular straight segments is connected to the non-abutting ends of coil segments 270–276 and 280–286. The supplemental coil segments supply additional magnetic flux to the plasma periphery. The additional series-connected segments are illustrated in FIG. 9 as being co-planar with the straight segments of center and intermediate coil portions 110 and 130, as well as straight segments 260–276 and 280–286 of the peripheral portion of the main coil part. However, the supplemental portions can be closer to the plasma than the remainder of the coil; in such an instance, the supplemental straight conductors would be slightly above the upper faces of windows 21–24, considerably closer to the windows than main coil part conducting segments 270–276 and 280–286. To decouple magnetic flux in conductors connecting the supplemental conductors to the ends of conducting segments 270–276 and 280–286, the supplemental conducting segments are connected to these ends of the conducting segments of the main peripheral part of the coil by metal electrically conducting struts 310, having the same dimensional and positional attributes as discussed supra for the conducting struts of FIGS. 2–4.

In particular, corners 291–296 where straight conductor segments 270, 272, 274, 276, 280, 282, 284 and 286 almost, but do not quite, intersect are respectively connected to additional conductor segments 301–306 by diagonally extending metal struts 310. Each of additional conducting segments 301–306 includes two straight intersecting conducting elements 312 and 314, respectively extending parallel to rails 28 and 30. Conducting elements 312 and 314 of each of supplemental conducting portions 301–306 intersect at a point substantially aligned with the "corner" in the gap defined by the projection of the mutually orthogonal straight conductor segments of the main part of the coil next to a particular additional segment. Conducting elements 312 and 314 are spatially close to the conducting segments of the main part of the coil and are electrically connected in series with these straight conducting segments of the main part of the coil. The spatial arrangement of conductors 312 and 314 and of the straight conducting segments of the main coil part is such that the currents in elements 312 and 314 flow in the same direction as the currents which flow in the portions of conducting segments 270, 272, 274, 276, 280, 282, 284 and 286 with which the particular pair of conducting elements 312 and 314 is adjacent. Thereby, magnetic fluxes resulting from the currents flowing in conducting elements 312 and 314 and conducting segments 270–276 and 280–286 are additive in the peripheral parts of the plasma, to increase the plasma flux density in the plasma periphery relative to the prior art of FIG. 1.

Current flows in struts 310 in a direction opposite to the direction of current flow in elements 310 and 312, as well as opposite to the direction of current flow in the main core conducting segments 270–276 and 280–286 spaced closest to the particular strut. To prevent the magnetic flux associated with the current flowing in struts 310 from materially adversely affecting the magnetic flux density and the plasma flux density in the peripheral parts of the plasma, the upper legs of struts 310 are substantially displaced from elements 312 and 314, as discussed supra. In the specific embodiment illustrated in FIG. 9, conducting elements 312 and 314 are coplanar with the conducting segments of the main part of the coil; however, it is to be understood that elements 312 and 314 can be positioned so they almost abut the faces of windows 21–24, i.e., are closer to the plasma than the conducting segments of the main part of the coil.

The coil of FIG. 9 has additional series, straight, metal conducting elements 316 and 318 (extending parallel to rail 30) that are connected between the main part of the coil and output terminals 108 and 109 by struts 319, that are identical to struts 310. Opposite ends of element 316 are connected to terminal 108 directly and to an end of conductor 284 adjacent additional corner segment 304 by one of struts 319, while opposite ends of element 318 are connected to terminal 109 directly and to an end of conductor 286 adjacent additional corner segment 304 by the other one of struts 319. Struts 319 have an inverted U shape, arranged so the legs thereof extending parallel to faces 21 and 24 are substantially farther from the plasma than the conducting segments in the main part of the coil. The magnetic fluxes from element 316 and conductor 284 add at the coil corner adjacent terminal 108 and the magnetic fluxes from element 318 and conductor 286 add at the coil corner adjacent terminal 109. There are negligible magnetic flux bucking effects resulting from currents flowing in struts 309.

Figure 10:
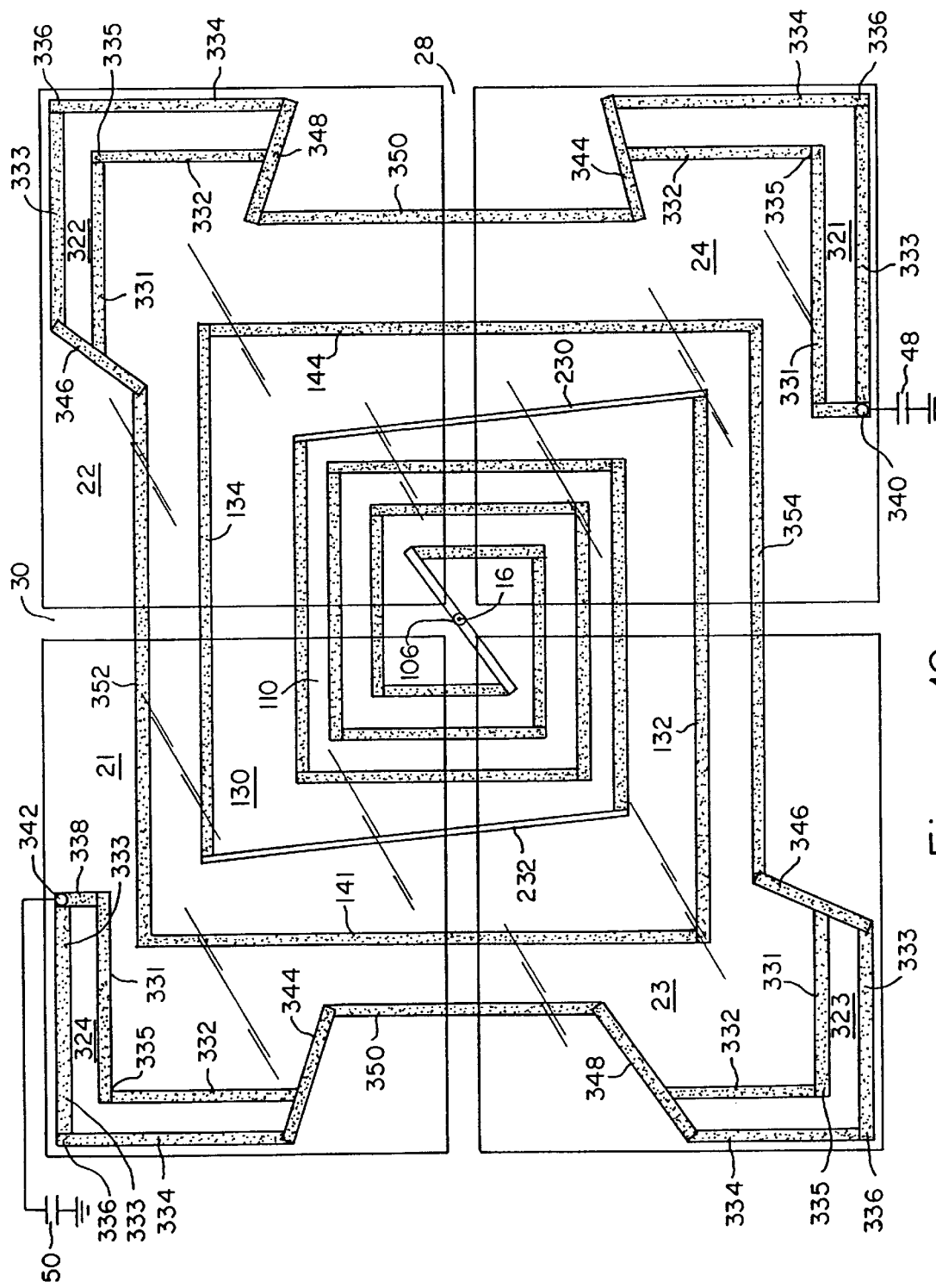

Reference is now made to FIG. 10 of the drawing, another modification of the coil illustrated in FIG. 4. In the coil of FIG. 10, the magnetic flux density and plasma flux density in the peripheral corners of the plasma are substantially increased relative to the prior art of FIG. 1 by modifying the peripheral portion of the coil to include supplemental conductor segments 321–324, one of which is at each of the four peripheral corners of the coil. Each of supplemental peripheral corner coil segments 321–324 includes four straight conductor elements 331–334, arranged so elements 331 and 333 extend parallel to rail 28, while elements 332 and 334 extend parallel to rail 30. Elements 331 and 333 intersect in the peripheral part of the coil at corner 335, while elements 333 and 334 intersect at the peripheral corners of the coil at corner 336. Elements 331 and 332 thus form a first leg which is inside of and nested with a second leg formed by elements 333 and 334. Ends of straight conducting elements 331 and 333 of corner segments 321 and 324 remote from corners 335 and 336 are connected to each other by straight conducting element 338, extending parallel to rail 30.

Terminals 340 and 342 of the coil illustrated in FIG. 10 are at the corners defined by the intersections of elements 333 and 338 of corner segments 321 and 324, respectively. Terminals 340 and 342 are connected to the ground or output terminal of the matching network (not shown in FIG. 10) by series connections established through capacitors 48 and 50, respectively. Thus, the peripheral terminals of the coil illustrated in FIG. 10 are displaced from the corners of the coil, in contrast to the coil configurations of each of FIGS. 1–4 and 9.

Corner segments 321 and 324, each including a pair of parallel electrical conducting paths, are thus respectively electrically in series with the coil output terminals 340 and 342 and the remainder of the coil. The series connections are established through metal struts 344, each of which extends diagonally outwardly from the main part of the coil and is electrically connected to the ends of elements 332 and 334 remote from corners 335 and 336, to assist in establishing the parallel current paths of corner segments 321 and 324. Elements 331 and 332 have approximately the same length, which is somewhat shorter than the equal lengths of elements 333 and 334.

Corner segments 322 and 323 differ somewhat from corner segments 321 and 324 because there are no terminals at corner segments 322 and 323. Corner segments 322 and 323 are electrically connected to the remainder of the coil by diagonally and outwardly extending metal struts 346 and 348; strut 346 is connected to the ends of conductor elements 331 and 333 (of corner segments 322 and 323) which are remote from corners 335 and 336. Similarly, metal struts 348 are electrically connected to the ends of conductor elements 332 and 334 of corner segments 322 and 323, which element ends are remote from corners 335 and 336, respectively.

The ends of conducting struts 344 and 348 which are toward the interior of the coil illustrated in FIG. 10 are connected together by straight conductor segments 350, both of which extend parallel to and are on opposite sides of rail 30 and extend in opposite directions by equal amounts away from rail 28. Segments 350 are removed from the outer periphery of the coil illustrated in FIG. 10, but are positioned sufficiently close to the peripheries of windows 21–24 to add magnetic flux to the peripheral portion of the plasma and increase the plasma flux density in the peripheral part of the plasma at regions removed from the corners of the plasma and the workpiece.

The inner ends of conducting struts 346 remote from corner segments 322 and 323 are connected to an end of each of conductor segments 352 and 354, both of which extend parallel to rail 28. The other ends of conductor segments 352 and 354 are respectively connected to the ends of conductor segments 141 and 142 remote from conductor segments 130 and 132. Conductor segments 352 and 354, in the peripheral portion of the coil, are respectively connected to one end of segments 141 and 144 of the intermediate portion of the coil that also includes conductor segments 132 and 134. The ends of conductor segments 132 and 134 are respectively connected to interior coil portion 110 by struts 230 and 232 in the same manner that the intermediate portion of the coil of FIG. 4 is connected to the interior portion 110 thereof.

Segments 350 are positioned inwardly from the periphery of the coil illustrated in FIG. 10 to provide greater uniformity of the plasma flux density incident on the workpiece than is attained with the prior art coil of FIG. 1. The plasma flux density has a tendency to be lower in the peripheral corners of the chamber than in the peripheral portions of the chamber removed from the corners. To reduce this effect, straight segments 350 are set back from the outer coil periphery.

Each of metal struts 344, 346 and 348 has four legs, a first of which extends parallel to the faces of windows 21–24 and is positioned substantially farther from windows 21–24 than conductor segments 331–334 of peripheral portions 321–324. The remaining three legs of each of struts 344, 346 and 348 extend vertically between the first leg of the strut and one of conductor segments 331–334, 352 and 354, as appropriate. The construction and positions of struts 344, 346 and 348 minimize the magnetic flux effects of the struts on the plasma.

It is to be understood, however, that the conducting segments in the coil of FIG. 10 can be modified, as appropriate, so the conducting segments of peripheral portions 321–324 are closer to windows 21–24 than the remaining conductor segments of the coil.

Figure 11:
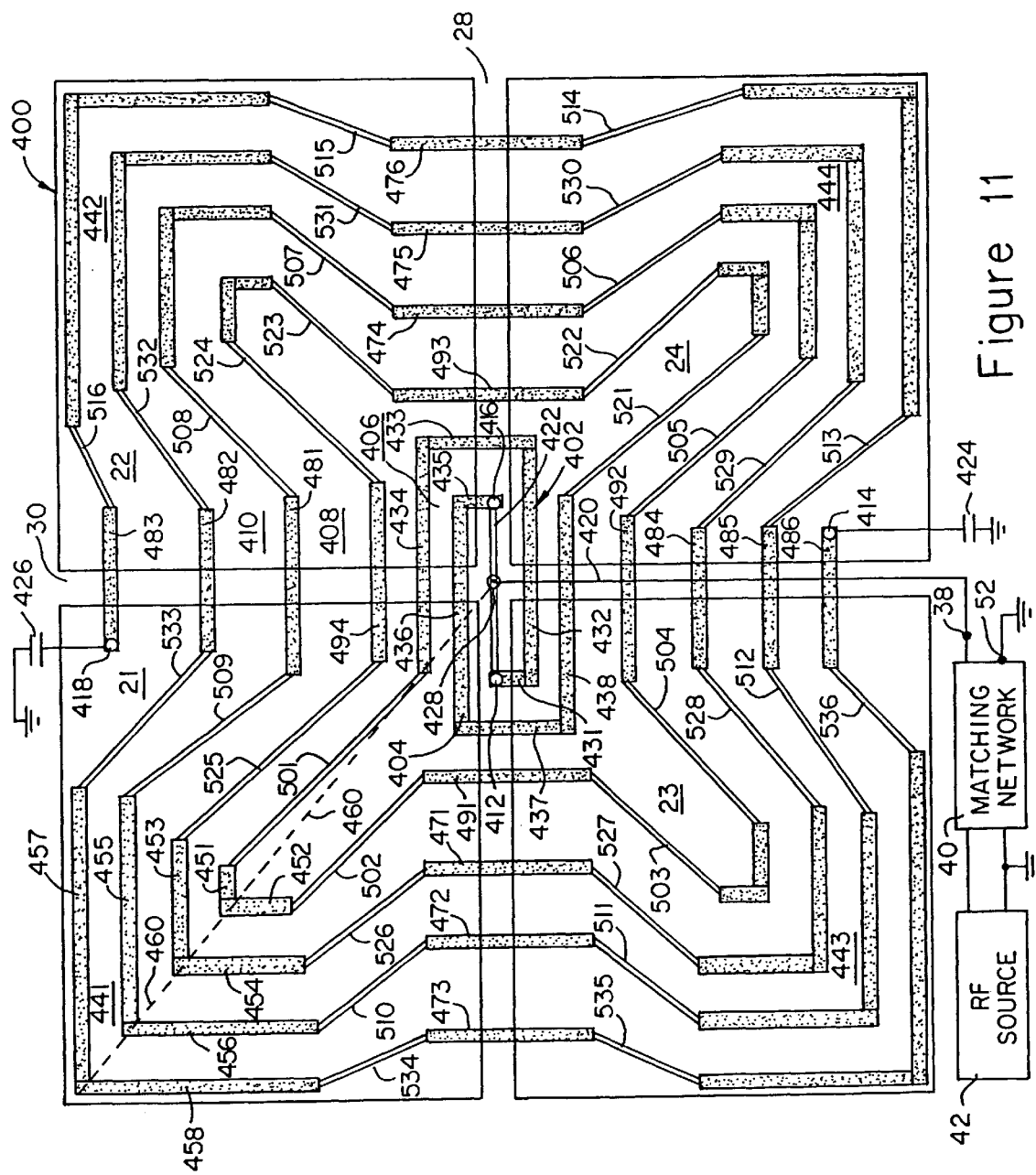
FIG. 11 is a top view of another coil including several nested conducting corner segments in accordance with the present invention.

Reference is now made to FIG. 11 of the drawing, a bottom view of still a further coil in accordance with the invention. In the coil of FIG. 11, a more uniform plasma flux density is generated at workpiece peripheral regions by adding segments to the corner locations of the turns of a pair of parallel windings forming a main coil. The added corner segments are connected in series with the remainder of each winding. Each winding has short (relative to the short segments of the coils of FIGS. 2–4 and 9) straight conducting segments in series between the added segments at a pair of corners in different adjacent quadrants of the coil, i.e., at or close to peripheral corners of adjacent ones of windows 21–24. The short straight segments cause a relatively large gap between the corner segments and the straight segments compared to the gaps between the corners and straight segments in the coil of FIG. 9; of course there is no gap between the corners and straight segments in the coils of FIGS. 1–4. Additionally, the lengths of the straight segments of the main coil have been substantially reduced to increase the gap between the corners and the short straight segments removed from the corners. The coil of FIG. 11 is characterized by complete symmetry and has great flexibility through selective use of different conductor segments thereof. The coil of FIG. 11 includes two parallel windings 402 and 404, which together form interior, intermediate and peripheral portions 406, 408 and 410 of the coil. Winding 402 includes interior and exterior terminals 412 and 414, while winding 404 includes interior and exterior terminals 416 and 418. Interior terminals 412 and 416 are connected to ungrounded output terminal 38 of matching network 40 by cable 420 and U-shaped strut 422 while terminals 414 and 418 are connected by capacitors (i.e. reactive impedances) 424 and 426 to the grounded output terminal of matching network 40. The values of capacitor 424 and 426 and the lengths of windings 402 and 404 relative to the wavelength of source 42 are such that the peak standing wave current occurs approximately in the center of exterior portion 410 of the coil. Interior terminals 412 and 416 are positioned along a line extending through center point 428 of the coil, as well as on the center longitudinal axis of rail 28. Exterior terminals 414 and 418 are equispaced from coil center 428 and diagonally located on opposite sides of the longitudinal axis of rail 30.

Interior coil portion 406 includes straight coil segments 431, 432, 433 and 434 of winding 402, as well as straight coil segments 435, 436, 437 and 438 of winding 404. Coil segments 431, 433, 435 and 437 extend parallel to rail 30, while straight coil segments 432, 434, 436 and 438 extend parallel to rail segment 28, with segment 432 intersecting segments 431 and 433, segments 433 and 434 intersecting, segment 436 intersecting segments 435 and 437, and segments 437 and 438 intersecting.

Peripheral coil portion 410 includes straight conducting segments at corners 441, 442, 443 and 444 of windows 21, 22, 23 and 24, respectively. Since each of the straight conducting segments at each of corners 441–444 is identical, a description of the straight conducting segments 451–458 of only corner 441 is given.

Straight conducting segments 451–458 form four nested corners, such that conducting segments 451, 453, 455 and 457 extend parallel to rail 28, while conducting segments 452, 454, 456 and 458 extend parallel to rail 30. Straight conducting segments 451–458 are arranged in pairs, such that adjacently numbered conducting segments form one pair and have abutting ends at a corner. The corners formed by conducting segments 451–458 are aligned along line 460, that intersects coil center point 428. Conducting segments 451, 453, 455 and 457 have progressively increasing lengths in the stated order, and conducting segments 452, 454, 456 and 458 have progressively increasing lengths in the stated order. The lengths of segments 451–458 are such that the ends of segments 451, 453, 455 and 457 spaced from line 460 are progressively farther from rail 30, while the ends of segments 454, 456 and 458 spaced from line 460 are equispaced from rail 28, but the end of segment 452 spaced from line 460 is farther from rail 28 than segments 454, 456 and 458. The nested arrangement of conductors 451–458 causes a substantial increase in magnetic flux density (relative to the coil of FIG. 1) in the plasma peripheral corner below coil corner 441. The magnetic flux density derived from each of corners 441–444 is greatest below the exterior region of the coil and decreases toward the center of the coil so the magnetic flux density established by the conducting segments of the corners is somewhat less in the plasma portion below short conducting segments 451, 452 than it is in the plasma portion below long conducting segments 457, 458. This variation in magnetic flux density in the plasma has a tendency to make the plasma flux density more uniform in the corners relative to the prior art of FIG. 1.

Peripheral coil portion 410 also includes straight, equal length conducting segments 471–476 that extend at right angles to the longitudinal axis of rail 28, such that the ends of conducting segments 471–476 are equispaced from the axis of rail 28; segments 471–473 are on the same side of rail 30 as terminal 30 and segments 474–476 are on the opposite side of rail 30. Peripheral coil portion 410 also includes straight, equal length conducting segments 481–486 which extend at right angles to the longitudinal axis of rail 30 and have opposite ends equispaced from the longitudinal axis of rail 30. Conducting segments 481–483 are located on the side of coil 400 between center point 428 and terminal 418, while conducting segments 484–486 are located on the opposite side of coil 400, i.e., the side between coil center point 428 and terminal 414.

Intermediate coil portion 408 includes straight coil segments 491–494, wherein equal length coil segments 491 and 493 are equidistant from coil center point 428 along rail 20 and extend at right angles to the longitudinal axis of rail 28, such that opposite ends of each of coils 491 and 493 are equispaced from the rail 28 longitudinal axis. Each of segments 491 and 493 has the same length as coil segments 471–476, whereby the ends of all of straight coil segments 471–476, 491 and 493 are equidistant from the longitudinal axis of rail 28. Each of straight coil segments 492 and 494 has the same length as coil segments 481–486 and extends at right angles to the longitudinal axis of rail 30, such that the centers of coil segments 492 and 494 are coincident with the longitudinal axis of rail 30 and are on opposite sides of coil center point 428.

The conducting segments of winding 402 are interconnected by electric conducting metal struts 501–516, while the conducting segments of winding 404 are connected by electric conducting metal struts 521–536. The conducting segments and struts are arranged whereby the interlaced turns of parallel windings 402 and 404 extend radially and circumferentially in a spiral like manner between interior terminals 412 and 416 and exterior terminals 414 and 418. Each of struts 501–516 and 521–536 has an inverted U shape and is constructed basically the same as the struts of FIGS. 2–4, 9 and 10 so as not to appreciably affect the RF fields derived from conducting segments 431–438, 451–458, 471–476, 481–486 and 491–494. The latter conducting segments are coplanar in the coil illustrated in FIG. 11 but in other coils peripheral conducting segments 455–458 are closer to windows 21–24 than others of the conducting segments.

Typically, the length of each of windings 402 and 404 is less than one-half of a wavelength of the RF excitation frequency derived by RF source 42. The values of capacitors 424 and 426 and the lengths of windings 402 and 404 are such that (1) the peak standing wave current occurs in each of windings 402 and 404 in a middle part of peripheral winding portion 410 and (2) the standing wave current at interior terminals 412 and 416 of windings 402 and 404 is relatively low. Typical points where the maximum standing wave currents occur in windings 402 and 404 are at the centers of conducting portions 472 and 475. The standing wave voltages at interior terminals 412 and 416 are relatively high and decrease to relatively low values at exterior terminals 414 and 418.

The instantaneous current flow in the conducting segments of windings 402 and 404, other than in struts 501–516 and 521–536, is in the same direction in spatially adjacent conducting segments. For example, the instantaneous current flow in conducting segments 437, 491 and 471–473 is in the same spatial direction, which is opposite to the spatial direction of the instantaneous current flow in conducting segments 433, 493 and 474–476. The spatial direction of instantaneous current flow in each of conducting segments 432, 438 and 484–486 is the same, opposite to the spatial direction of instantaneous current flow in each of conducting segments 434, 494 and 481–483. Similarly, the current flow in conducting segments 451–458 of a particular corner is always instantaneously in the same spatial direction. The values of capacitors 48 and 50 of the coils of FIGS. 2–4 and 9–11 and the lengths of the windings of the previously described embodiments are such that the standing wave current in the two parallel windings does not change. In all of these coils the spatial direction of instantaneous current flow in spatially adjacent conductor segments is the same. As a result, the magnetic fluxes derived from spatially adjacent conducting segments of the coils of FIGS. 2–4 and 9–11 are additive to increase the magnetic flux density and plasma flux density in the center and peripheral portions of the vacuum chamber.

Segments 431–438 form a tightly pitched center coil portion 406, while segments 451–458 (at all four corners 441–444), 481–486, 492 and 494 form open pitched intermediate and peripheral portions 408 and 410. The turns of center portion 406 are connected to and are spatially separate from the turns of intermediate and peripheral portions 408 and 410, such that there is significant self coupling of the RF magnetic field derived from center coil portion 406 without substantial magnetic field cross coupling with RF magnetic fields derived from the remainder of the coil including portions 408 and 410.

Thereby, the magnetic flux density coupled by coil center portion 406 to the center of the plasma is easily controlled by proper design of the coil center portion. In the coils of FIGS. 2–4 and 9–11, the magnetic flux density supplied by the center portion of the coil to the center of the plasma is substantially higher than the magnetic flux density coupled to the plasma by the center of the coil of FIG. 1 to increase the plasma flux densities in the center of the plasma relative to the prior art of FIG. 1.

We have found that the etch uniformity achieved with the coil of FIG. 11, in planar form, was improved relative to that achieved with the three-dimensional coil of FIG. 4 when the coil of FIG. 11 was modified to omit (1) segments 451–454 of each of corners 441–444, and (2) segments 476, 474, 481, 484, 491–494. In this configuration, segments 434 and 509 were connected by a first conducting strut and segments 438 and 529 were connected by another conducting strut, the center portion of the coil was the same as in FIG. 2–4, 9 and 10, all the coil segments had a ⅛"×1" cross section, and all parts of the coil (including the struts) were co-planar.

While there have been described and illustrated several specific embodiments of the invention, it will be clear that variations in the details of the embodiments specifically illustrated and described may be made without departing from the true spirit and scope of the invention as defined in the appended claims.

We claim:

1. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the RF field derived from a main part of the coil interacting with an electromagnetic shield, the electromagnetic shield substantially confining the coil RF field to structure associated with the processor and interacting with the RF field derived from the main coil part in such a manner as to tend to reduce (a) the RF field derived from the main coil part in a part of the plasma generally aligned with a peripheral portion of the main coil part and (b) plasma flux density in the part of the plasma generally aligned with the main coil part peripheral portion relative to flux density of a portion of the plasma generally inside the part of the plasma generally aligned with the main coil part peripheral portion, the main coil part peripheral portion including an additional coil structure for supplying an additional amount of RF field to the portion of the plasma generally aligned with the main coil part peripheral portion, the additional amount of RF field supplied increasing the plasma flux density in the part of the plasma generally aligned with the main coil part peripheral portion.

2. The vacuum plasma processor of claim 1 wherein the additional coil structure is spatially adjacent to and connected electrically in parallel with the main coil part peripheral portion.

3. The vacuum plasma processor of claim 2 wherein there is different spacing, relative to the plasma in a direction at right angles to a treated workpiece surface, of the additional coil structure and the main coil part.

4. The vacuum plasma processor of claim 2 wherein the main coil peripheral portion includes at least one corner, the additional coil structure being spatially adjacent to and connected electrically in parallel with conductor segments of the main coil forming the corner.

5. The vacuum plasma processor of claim 4 wherein the main coil peripheral portion includes at least one end terminal, the additional structure being connected electrically in parallel with the end terminal and a coil conductor segment including and adjacent the end terminal.

6. The vacuum plasma processor of claim 5 wherein there is different spacing relative to the plasma, in a direction at right angles to a treated workpiece surface, of the additional coil structure and the main coil part.

7. The vacuum plasma processor of claim 6 wherein the coil includes plural windings electrically connected in parallel with each other, each of the plural windings extending radially and circumferentially between interior and exterior terminals of the coil.

8. The vacuum plasma processor of claim 7 wherein the coil includes a center point and the windings are interlaced as well as approximately spatially and electrically symmetrical with respect to the center point.

9. The vacuum plasma processor of claim 8 wherein each of the windings includes at least several intersecting straight conducting segments.

10. The vacuum plasma processor of claim 2 wherein the main coil peripheral portion includes at least one end terminal of the coil, the additional structure being connected electrically in parallel with the end terminal and a coil conductor segment including and adjacent the end terminal.

11. The vacuum plasma processor of claim 1 wherein the additional structure is spatially adjacent to and connected electrically in series with the main coil peripheral portion.

12. The vacuum plasma processor of claim 11 wherein there is different spacing relative to the plasma, in a direction at right angles to a treated workpiece surface, of the additional coil structure and the main coil part.

13. The vacuum plasma processor of claim 11 wherein the main coil peripheral portion includes a pair of adjacent, non-contacting conductor segments having ends that almost form a corner, the additional coil structure being connected electrically in series with the ends of the conductor segments that almost form a corner.

14. The vacuum plasma processor of claim 13 wherein the main coil peripheral portion includes at least one peripheral end terminal of the coil, the additional structure being connected electrically in series between the end terminal and a coil conductor segment adjacent the end terminal.

15. The vacuum plasma processor of claim 14 wherein there is different spacing relative to the plasma, in a direction at right angles to a treated workpiece surface, of the additional coil structure and the main coil part.

16. The vacuum plasma processor of claim 1 wherein the main coil peripheral portion includes a pair of adjacent conductor segments having adjacent ends for coupling to the plasma magnetic fields having axes displaced approximately 90° with respect to each other, the additional structure being spatially adjacent the adjacent ends and electrically connected to the adjacent conductor segments for establishing in the plasma magnetic fields that aid the magnetic fields coupled to the plasma by the adjacent conductor segments.

17. The vacuum plasma processor of claim 16 wherein the adjacent conductor segments abut to form a corner and the additional structure includes a conductor segment spatially adjacent the corner and electrically connected in parallel with the conductor segments forming the corner.

18. The vacuum plasma processor of claim 17 wherein there is different spacing relative to the plasma, in a direction at right angles to a treated workpiece surface, of the additional coil structure and the mail coil part.

19. The vacuum plasma processor of claim 16 wherein the adjacent conductor segments are spaced almost to form a corner and the additional coil structure includes a conductor segment spatially adjacent the corner and electrically connected in series with the adjacent conductor segments almost forming the corner.

20. The vacuum plasma processor of claim 19 wherein there is different spacing relative to the plasma, in a direction at right angles to a treated workpiece surface, of the additional coil structure and the main coil part.

21. The vacuum plasma processor of claim 16 wherein there is different spacing relative to the plasma, in a direction at right angles to a treated workpiece surface, of the additional coil structure and the main coil part.

22. The vacuum plasma processor of claim 1 wherein there is different spacing relative to the plasma, in a direction at right angles to a treated workpiece surface, of the additional coil structure and the main coil part.

23. The vacuum plasma processor of claim 1 wherein the coil includes interior and exterior terminals connected via a matching network to an RF source.

24. The vacuum plasma processor of claim 23 wherein the coil includes plural windings connected in parallel so current flows between the matching network and the plural windings via the terminals.

25. The vacuum plasma processor of claim 24 wherein the plural windings are interlaced as well as being approximately spatially and electrically substantially symmetrical about a center point of the coil.

26. The vacuum plasma processor of claim 24 wherein each of the windings includes plural turns extending radially and circumferentially between the interior and exterior terminals.

27. The vacuum plasma processor of claim 26 wherein at least some of the turns include plural straight segments.

28. The vacuum plasma processor of claim 26 wherein all of the turns include plural straight segments.

29. The vacuum plasma processor of claim 28 wherein all of the turns include only straight segments.

30. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil having a peripheral portion including a pair of adjacent conductor segments having adjacent ends, the adjacent conductor segments forming corners and coupling to the plasma magnetic fields having longitudinal axes forming corners so the magnetic fluxes in peripheral parts of the plasma define corners, the coil being arranged so the magnetic flux density in the corners formed by the adjacent conductor segments is substantially greater than the magnetic flux density in other peripheral parts of the coil.

31. The vacuum plasma processor of claim 30 wherein the coil includes an additional segment spatially close to each of the corners and connected electrically in parallel with the conductor segments forming the corner.

32. The vacuum plasma processor of claim 31 wherein the parallel segment and corner have different spacings from the plasma in a direction at right angles to a treated workpiece surface.

33. The vacuum plasma processor of claim 30 wherein the coil includes exterior terminals and the corners formed by the adjacent conductor segments are at the periphery of the coil, the exterior terminals being approximately midway between a pair of the corners at the periphery of the coil.

34. The vacuum plasma processor of claim 30 wherein the coil peripheral portion includes a pair of adjacent, non-contacting conductor segments having ends that almost form a corner, the additional structure being connected electrically in series with the ends of the conductor segments that almost form a corner, the coil including a further segment spatially close to the adjacent segment ends almost forming the corner and connected electrically in series with the adjacent conductor segments almost forming the corner.

35. The vacuum plasma processor of claim 34 wherein the further segment and the adjacent segment ends almost forming the ends have different spacings relative to the plasma in a direction at right angles to a treated workpiece surface.

36. The vacuum plasma processor of claim 30 wherein the coil peripheral portion includes plural adjacent pairs of said adjacent conductor segments.

37. The vacuum plasma processor of claim 36 wherein the plural adjacent pairs are nested.

38. The vacuum plasma processor of claim 36 wherein said adjacent conductor segments are at corners of the coil.

39. The vacuum plasma processor of claim 38 wherein the coil includes additional conductor segments for supplying substantial magnetic flux density to the plasma and further conductor segments connected between the adjacent conductor segments at the coil corners and the additional conductor segments, the further conductor segments supplying substantially lower magnetic flux density to the plasma than either the additional or adjacent conductor segments.

40. The vacuum plasma processor of claim 30 wherein the coil includes interior and exterior terminals connected via a matching network to an RF source.

41. The vacuum plasma processor of claim 40 wherein the exterior terminals are diametrically opposed.

42. The vacuum plasma processor of claim 41 wherein the coil includes peripheral corners, the exterior terminals being at a pair of the peripheral corners of the coil.

43. The vacuum plasma processor of claim 41 wherein the coil includes plural windings connected in parallel so current flows between the matching network and the plural windings via the terminals.

44. The vacuum plasma processor of claim 43 wherein the plural windings are interlaced as well as approximately spatially and electrically symmetrical about a center point of the coil.

45. The vacuum plasma processor of claim 43 wherein each of the windings includes plural interlaced turns extending radially and circumferentially between the interior and exterior terminals.

46. The vacuum plasma processor of claim 45 wherein at least some of the turns include plural straight segments.

47. The vacuum plasma processor of claim 45 wherein all of the turns include plural straight segments.

48. The vacuum plasma processor of claim 45 wherein all of the turns include only straight segments.

49. The vacuum plasma processor of claim 30 wherein the coil includes a main part and an additional conductor segment, the additional conductor segment being spatially close to the adjacent ends and electrically connected to the adjacent conductor segments for establishing in the plasma magnetic fields that aid the magnetic fields coupled to the plasma by the adjacent conductor segments.

50. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including plural electrically conducting windings, each having sufficient length at the frequency of the RF field to have transmission line effects so there is a peak standing wave RF current therein, each winding including different portions having differing spacings from the plasma in a direction at right angles to a face of the workpiece exposed to the plasma.

51. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including peripheral and other non-peripheral conducting portions, the coil including a conductor segment connected electrically only to the peripheral portion of the coil and located spatially close to the peripheral portion of the coil, the peripheral portion of the coil and the conductor segment being arranged so RF fields established by them add in a portion of the plasma to increase the plasma flux density in the portion of the plasma.

52. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including first and second electrical conducting portions connected electrically in series, the first and second conducting portions being in spatially different parts of the coil, the coil including a conductor segment connected electrically in parallel with only the first conducting portion and located spatially close to the first conducting portion, the first conducting portion and the conductor segment being arranged so RF fields established by them add in a portion of the plasma to increase the plasma flux density in the portion of the plasma.

53. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including first and second conducting segments having spatially close ends spaced from each other by a gap, a third conducting segment connected electrically in series with the ends of the first and second conducting segments and spatially close to said first conducting segment, the first and third conducting segments being arranged so RF fields established by them add in a portion of the plasma to increase the plasma flux density in the portion of the plasma.

54. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including first and second electrical conducting portions connected electrically in series, the first and second conducting portions being in spatially different parts of the coil, the coil including a conductor segment connected electrically in parallel with only the first conducting portion and located spatially close to the first conducting portion, the first conducting portion and the conductor segment being arranged so RF fields established by them add in a portion of the plasma to increase the plasma flux density in the portion of the plasma.

55. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including first and second conducting segments having spatially close ends spaced from each other by a gap, a third conducting segment connected electrically in series with the ends of the first and second conducting segments and spatially close to said first conducting segment, the first and third conducting segments being arranged so RF fields established by them are in a portion of the plasma to increase the plasma flux density in the portion of the plasma.

56. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including center and other portions each having a number of winding turns, the turns of the center portion having a tighter pitch than the turns of the other portion, the turns of the center and other portions being connected to each other and spatially arranged such that there is significant self coupling of an RF magnetic field derived by the center portion without substantial cross coupling of the RF magnetic field derived by the center portion with RF magnetic fields derived from the other portion of the coil.

57. The vacuum plasma processor of claim 56 wherein the coil includes plural multi-turn windings connected in parallel, the plural windings being included in the center and other portions of the coil.

58. The vacuum plasma processor of claim 57 wherein each of the windings extends radially and circumferentially from a center point.

59. The vacuum plasma processor of claim 58 wherein each of the windings has interior and exterior terminals and the turns of the plural windings are interlaced.

60. The vacuum plasma processor of claim 56 wherein the RF field derived from a main part of the coil interacts with an electromagnetic shield, the electromagnetic shield substantially confining the coil RF field to structure associated with the processor and interacting with the RF field derived from the main coil part in such a manner as to tend to reduce (a) the RF field derived from the main coil part in a part of the plasma generally aligned with a peripheral portion of the main coil part and (b) plasma flux density in the part of the plasma generally aligned with the main coil part peripheral portion relative to flux density of a portion of the plasma generally inside the part of the plasma generally aligned with the main coil part peripheral portion, the main coil part peripheral portion including an additional coil structure for supplying an additional amount of RF field to the portion of the plasma generally aligned with the main coil part peripheral portion, the additional amount of RF field supplied increasing the plasma flux density in the part of the plasma generally aligned with the main coil part peripheral portion.

61. The vacuum plasma processor of claim 60 wherein the coil peripheral portion includes a pair of adjacent conductor segments having adjacent ends, the adjacent conductor segments forming corners and coupling to the plasma magnetic fields having longitudinal axes forming corners so the magnetic fluxes in peripheral parts of the plasma define corners, the coil being arranged so the magnetic flux density in the corners formed by the adjacent conductor segments is substantially higher than the magnetic flux density in other peripheral parts of the plasma.

62. The vacuum plasma processor of claim 61 wherein the coil includes plural electrically conducting windings, each having sufficient length at the frequency of the RF field to have transmission line effects so there is a peak standing wave RF current therein, each winding including different portions having differing spacings from the plasma in a direction at right angles to a face of the workpiece exposed to the plasma.

63. The vacuum plasma processor of claim 62 wherein the coil includes a conductor segment connected electrically only to the peripheral portion of the coil and located spatially close to the peripheral portion of the coil, the peripheral portion of the coil and the conductor segments being arranged so RF fields established by them add in a portion of the plasma to increase the plasma flux density in the portion of the plasma.

64. The vacuum plasma processor of claim 63 wherein the coil includes first and second electrical conducting portions connected electrically in series, the first and second conducting portions being in spatially different parts of the coil, the coil including a conductor segment connected electrically in parallel with only the first conducting portion and located spatially close to the first conducting portion, the first conducting portion and the conductor segments being arranged so RF fields established by them add in a portion of the plasma to increase the plasma flux density in the portion of the plasma.

65. The vacuum plasma processor of claim 64 wherein the coil includes first and second conducting segments having spatially close ends spaced from each other by a gap, a third conducting segment connected electrically in series with the ends of the first and second conducting segments and spatially close to said first conducting segment, the first and third conducting segments being arranged so RF fields established by them add in a portion of the plasma to increase the plasma flux density in the portion of the plasma.

66. The vacuum plasma processor of claim 65 for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil including first and second electrical conducting portions connected electrically in series, the first and second conducting portions being in spatially different parts of the coil, the coil including a conductor segment connected electrically in parallel with only the first conducting portion and located spatially close to the first conducting portion, the first conducting portion and the conductor segments being arranged so RF fields established by them add in a portion of the plasma to increase the plasma flux density in the portion of the plasma.

67. The vacuum plasma processor of claim 56 wherein the coil includes first and second conducting segments having spatially close ends spaced from each other by a gap, a third conducting segment connected electrically in series with the ends of the first and second conducting segments and spatially close to said first conducting segment, the first and third conducting segments being arranged so RF fields established by them are in a portion of the plasma to increase the plasma flux density in the portion of the plasma.

68. The vacuum plasma processor of claim 56 wherein the coil has a peripheral portion including a pair of adjacent conductor segments having adjacent ends, the adjacent conductor segments forming corners and coupling to the plasma magnetic fields having longitudinal axes forming corners so the magnetic fluxes in peripheral parts of the plasma define corners, the coil being arranged so the magnetic flux density in the corners formed by the adjacent conductor segments is substantially higher than the magnetic flux density in other peripheral parts of the plasma.

69. The vacuum plasma processor of claim 56 wherein the coil includes a conductor segment connected electrically only to the peripheral portion of the coil and located spatially close to the peripheral portion of the coil, the peripheral portion of the coil and the conductor segments being arranged so RF fields established by them add in a portion of the plasma to increase the plasma flux density in the portion of the plasma.

70. The vacuum plasma processor of claim 56 wherein the coil includes first and second electrical conducting portions connected electrically in series, the first and second conducting portions being in spatially different parts of the coil, the coil including a conductor segment connected electrically in parallel with only the first conducting portion and located spatially close to the first conducting portion, the first conducting portion and the conductor segments being arranged so RF fields established by them add in a portion of the plasma to increase the plasma flux density in the portion of the plasma.

71. A vacuum plasma processor for treating a workpiece with a plasma comprising a vacuum chamber where the workpiece is adapted to be located, the chamber having an inlet for introducing into the chamber a gas which can be converted into the plasma for treating the workpiece, a coil positioned to couple an RF field to the gas for exciting the gas to the plasma state, the coil having a peripheral portion including a pair of adjacent conductor segments having adjacent ends, the adjacent conductor segments forming corners and coupling to the plasma magnetic fields having longitudinal axes forming corners so the magnetic fluxes in peripheral parts of the plasma define corners, the peripheral portion including a further conductor segment electrically connecting an adjacent pair of the corners together, the further conductor segment including a portion between the adjacent corners, the further conductor segment portion extending inwardly from the remainder of the further conductor segment.

72. The vacuum plasma processor of claim 71 wherein the coil includes a plurality of said further conductor segments and a plurality of said further conductor segment portions.

73. The vacuum plasma processor of claim 72 wherein the plurality are in spatially different parts of the peripheral portion.

74. The vacuum plasma processor of claim 72 wherein the plurality are in spatially adjacent parts of the peripheral portion.

75. The vacuum plasma processor of claim 72 wherein some of the plurality are in spatially different parts of the peripheral portion and others of the plurality are in spatially adjacent parts of the peripheral portion.

76. The vacuum plasma processor of claim 71 wherein the further conductor segment, except for the inwardly extending portion thereof, extends substantially in a straight line between the adjacent corners.

* * * * *